United States Patent
Rose et al.

(10) Patent No.: US 10,536,185 B2
(45) Date of Patent: *Jan. 14, 2020

(54) LOW POWER, CENTRALIZED DATA COLLECTION

(71) Applicant: APANA Inc., Bellingham, WA (US)

(72) Inventors: Matthew W. Rose, Bellingham, WA (US); Frank Burns, Spokane, WA (US); Matthew Maher Peterson, Bellingham, WA (US); Canyon Daniel Peckham, White Salmon, WA (US); Valentin Siderskiy, Bellingham, WA (US); David Royce Humphrey, White Salmon, WA (US); Thomas Remmers, Bellingham, WA (US)

(73) Assignee: APANA Inc., Bellingham, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/935,285

(22) Filed: Mar. 26, 2018

(65) Prior Publication Data

US 2018/0294833 A1  Oct. 11, 2018

Related U.S. Application Data

(63) Continuation of application No. 15/423,500, filed on Feb. 2, 2017, now Pat. No. 9,929,771.

(Continued)

(51) Int. Cl.
*H04B 1/40* (2015.01)
*H04W 88/02* (2009.01)
(Continued)

(52) U.S. Cl.
CPC ............. *H04B 1/44* (2013.01); *G01D 4/004* (2013.01); *H02J 7/007* (2013.01); *H02J 7/0014* (2013.01);
(Continued)

(58) Field of Classification Search
CPC ..... H04W 4/008; H04W 28/10; H04W 52/02; H04W 52/0209; H04W 84/10;
(Continued)

(56) References Cited

U.S. PATENT DOCUMENTS 8,847,785 B2   9/2014  Heath
9,019,110 B2*  4/2015  Kates ................ G01N 33/0065
                                              340/628

(Continued)

FOREIGN PATENT DOCUMENTS

FR        3009623        2/2015
WO      WO0070313      11/2000
WO    WO2013156946     10/2013

OTHER PUBLICATIONS

Office Action for U.S. Appl. No. 15/423,512, dated Jul. 25, 2017, Rose et al., "Low Power, High Resolution Automated Meter Reading and Analytics", 8 pages.

(Continued)

*Primary Examiner* — Blane J Jackson
(74) *Attorney, Agent, or Firm* — Lee & Hayes, P.C.

(57) ABSTRACT

The systems and methods described herein are directed to techniques for improving battery life performance of end devices in resource monitoring systems which transmit data using low-power, wide area network (LPWAN) technologies. Further, the techniques include providing sensor interfaces in the end devices configured to communicate with multiple types of metrology sensors. Additionally, the systems and methods include techniques for reducing the size of a concentrator of a gateway device which receives resource measurement data from end devices. The reduced size of the concentrator results in smaller, more compact gateway devices that consume less energy and reduce heat dissipation experienced in gateway devices. The concentrator may comply with modular interface standards, and include two radios configured for transmitting 1-watt signals. Lastly, the systems and methods include techniques for (Continued)

fully redundant radio architecture within a gateway device, allowing for maximum range and minimizing downtime due to transmission overlap.

20 Claims, 28 Drawing Sheets

Related U.S. Application Data

(60) Provisional application No. 62/292,147, filed on Feb. 5, 2016, provisional application No. 62/432,431, filed on Dec. 9, 2016.

(51) Int. Cl.

| | |
|---|---|
| *H04B 1/44* | (2006.01) |
| *H04B 1/04* | (2006.01) |
| *H04B 1/10* | (2006.01) |
| *G01D 4/00* | (2006.01) |
| *H02J 7/00* | (2006.01) |
| *H04W 52/02* | (2009.01) |
| *H03F 3/24* | (2006.01) |
| *H02J 7/34* | (2006.01) |
| *H04W 84/18* | (2009.01) |
| *H04W 88/16* | (2009.01) |
| *H04W 88/06* | (2009.01) |

(52) U.S. Cl.
CPC ............. *H03F 3/24* (2013.01); *H04B 1/0475* (2013.01); *H04B 1/1036* (2013.01); *H04B 1/40* (2013.01); *H04W 52/028* (2013.01); *H04W 52/0277* (2013.01); *H02J 7/345* (2013.01); *H04B 2001/0408* (2013.01); *H04W 84/18* (2013.01); *H04W 88/02* (2013.01); *H04W 88/06* (2013.01); *H04W 88/16* (2013.01); *Y02B 90/242* (2013.01); *Y02B 90/246* (2013.01); *Y04S 20/322* (2013.01); *Y04S 20/42* (2013.01)

(58) Field of Classification Search
CPC ........ H04W 88/02; H04W 92/10; H04B 1/38; H04B 1/3827; H04B 1/40
See application file for complete search history.

(56) References Cited

U.S. PATENT DOCUMENTS

| | | | |
|---|---|---|---|
| 9,077,183 B2 | 7/2015 | Thomas et al. | |
| 9,929,771 B2* | 3/2018 | Rose .................. | H04B 1/44 |
| 9,977,415 B2* | 5/2018 | Zimmerman ........... | H04L 67/10 |
| 2006/0100002 A1 | 5/2006 | Luebke et al. | |
| 2008/0141754 A1 | 6/2008 | Kates | |
| 2013/0170417 A1 | 7/2013 | Thomas et al. | |
| 2013/0317659 A1 | 11/2013 | Thomas et al. | |
| 2014/0207393 A1 | 7/2014 | Brusilovsky | |
| 2015/0011169 A1 | 1/2015 | Kates | |
| 2015/0068069 A1 | 3/2015 | Tran et al. | |
| 2016/0095055 A1 | 3/2016 | Sarrigeorgidis et al. | |
| 2017/0005820 A1 | 1/2017 | Zimmerman et al. | |
| 2017/0154521 A1 | 6/2017 | Zamorano-Larrate | |
| 2017/0171778 A1 | 6/2017 | Britt et al. | |
| 2017/0230074 A1 | 8/2017 | Rose et al. | |
| 2017/0230907 A1 | 8/2017 | Rose et al. | |
| 2018/0287657 A1 | 10/2018 | Rose et al. | |
| 2019/0149973 A1* | 5/2019 | Berlin .................. | H04B 7/04 455/3.05 |

OTHER PUBLICATIONS

PCT Search Report and Written Opinion dated Mar. 21, 2017 for PCT Application No. PCT/US17/16411, 12 pages.
Office Action for U.S. Appl. No. 15/935,323, dated Jan. 9, 2019, Rose, "Low Power, High Resolution Automated Meter Reading and Analytics", 5 pages.
Office Action for U.S. Appl. No. 15/935,323, dated Jul. 26, 2018, Rose, "Low Power, High Resolution Automated Meter Reading and Analytics", 5 pages.
Partial Supplementary European Search Report dated Jul. 5, 2019 for European Patent Application No. 17748231.2, 16 pages.
Margelis et al, "Low Throughput Networks for the IoT: Lessons Learned from Industrial Implementations", 2015 IEEE 2nd World Forum on Internet of Things, IEEE, Dec. 14, 2015, pp. 181-186.
Extended European Search Report dated Oct. 10, 2019 for European Patent Application No. 17748231.2, 12 pages.

* cited by examiner

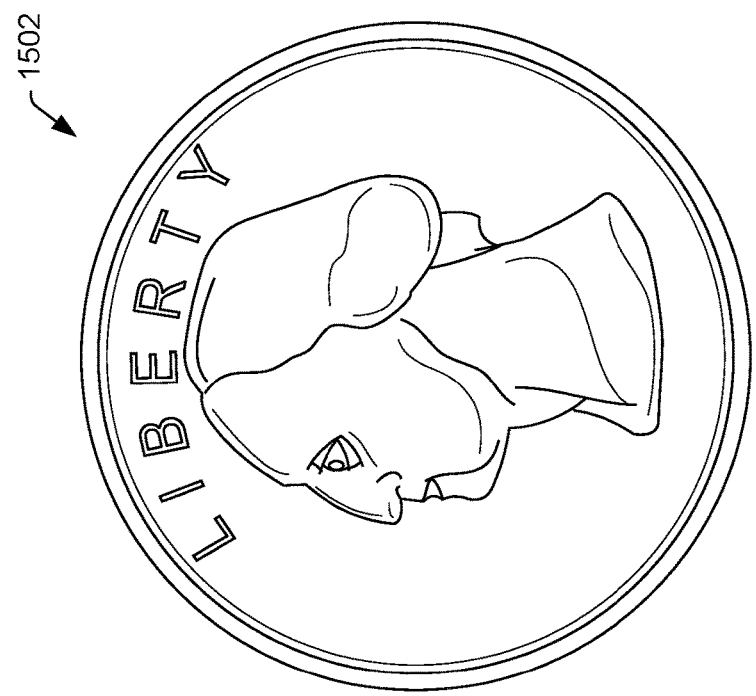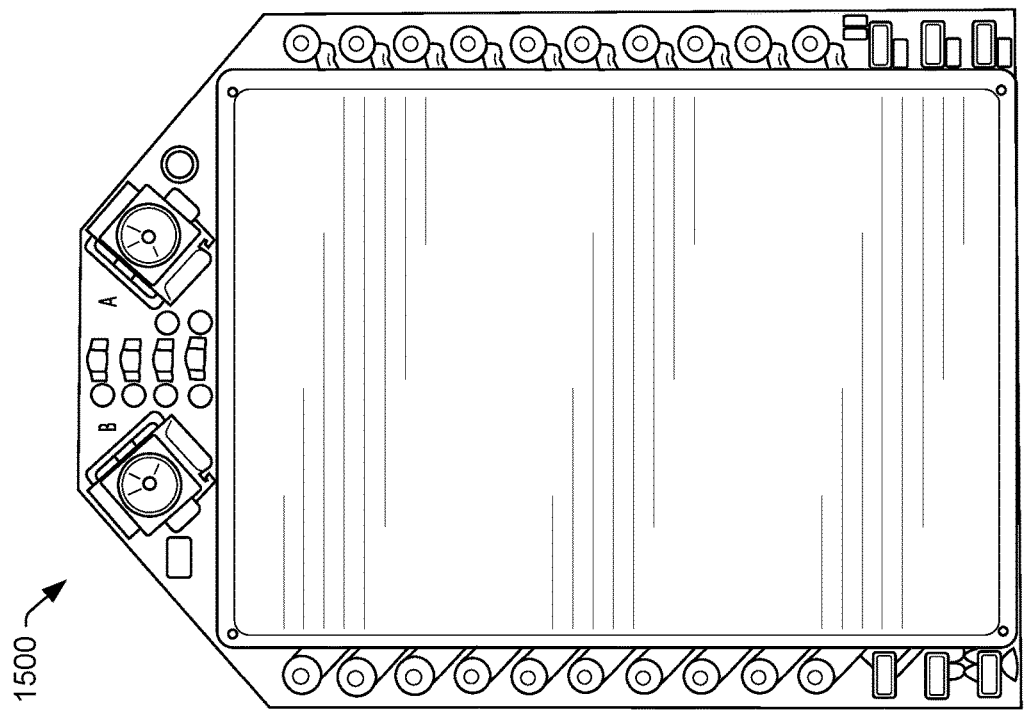
FIG. 15

← 1600

| SUSPECTED EVENT ALERT |
|---|

Sender

Customer #1 Suspected Waste

Sender Email
Reply Email
CC Address

ISSUE: There is currently a 11.0 gal/min constant water use that started at 12:43 today and is still running. The pattern is consistent with operational waste. This is the volume of 7 1/3 kitchen sinks or 1 3/4 garden hoses running.

RECOMMENDATION:
Walk fresh foods and areas where hoses are used to look for the types of waste events displayed in the image below.

Where to look now

ALL Floor Drains:
look for water flowing
from the pipes that
enter the floor drain.

Floor Drains:
* Refrigeration equipment area.
* Food Prep Areas
* Hot Water Heaters

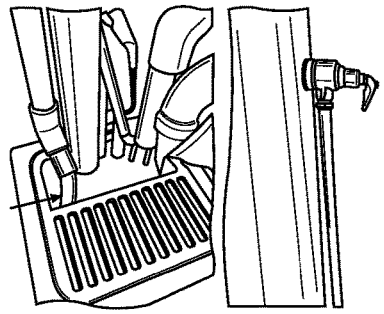
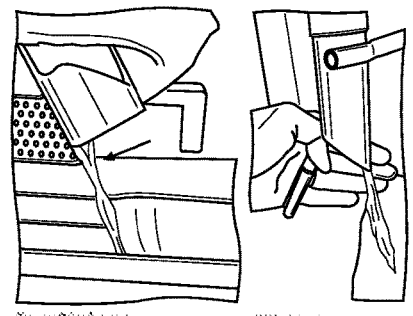

Fryer Discharge    CT2 Discharge

Hoses  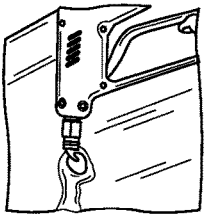  Fixtures and Faucets 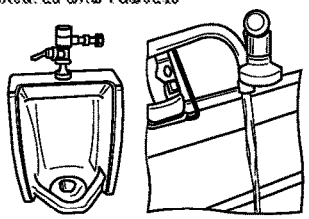  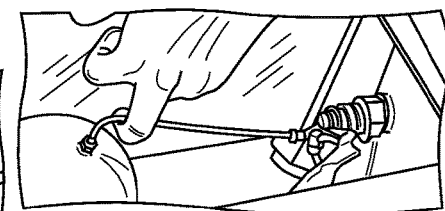

Link to Real Time Use

FIG. 16

| SITE INFO | | | | |
|---|---|---|---|---|
| NODE NAME | PURPOSE | VERSION | KEY | ANALYTICS |
| Name | Main | #### | ##:##:##:## | MECHANICAL OPERATIONAL (STEP) |

EVENT

| | |
|---|---|
| SITE NAME | Location Name |
| SITE CODE | ### |
| NODE | Node Name |
| EVENT DATE | 2016-02-02 |
| AUTO TYPE | MECHANICAL 1 |
| CLASS | AUTOMATED |
| COUNT | 0 |
| LEVEL | 4 |
| DURATION | 0 |

SITE ANALYTIC NOTES

STATUS
[ SENT ]

TYPE
[ MECHANICAL ]

LANGUAGE
[ ENGLISH ]

REVIEW FOR AUTOMATION
[ NO ]

REVIEW ALGORITHM
[ NO ]

TEAM REVIEW
[ NO ]

FOLLOW UP
[ NO ]

FOLLOW UP NOTE
[ ]

RESOLUTION
[ RESOLUTION ]

FIG. 19A

TICKET NOTES

[SAVE EVENT]

CHARTS

☑ LOCATION NAME
DAYS BACK
[1 ▼]
FLOW CALCULATION
[METER FLOW ▼]
[⟳ RE-CREATE CHARTS]
[CREATE POWERPOINT]

EMAIL
TO
☑ EMAIL1@CUSTOMER.COM
☑ EMAIL2@CUSTOMER.COM
☑ EMAIL3@CUSTOMER.COM
☑ EMAIL4@CUSTOMER.COM
☑ EMAIL5@CUSTOMER.COM
[EXTRA TO]
[EXTRA TO]
CC

FIG. 19B

| Extra cc |
|---|

| Extra cc |
|---|

☐ email1@address.com
☐ email2@address.com
☐ email3@address.com
☐ email4@address.com
☐ email5@address.com

*Subject*
Location Name; 2.2+ gal/min ongoing Water Waste (3,139 gal/day)

*Body*

ISSUE: 2.2+ gal/min water waste event observed this morning. This is the volume of at least 1 1/3 kitchen sinks or 1/3 garden hoses running.

RECOMMENDATION: On your next floor walk, use the attached image and REVIEW LIST below to do a quick review of the most likely causes.

IF you do not find the problem quickly, have the night manager use the image and instructions to do a more detailed inspection for water waste when conducting their final walk through. They will need a strong flashlight and about 10 min of extra time to look and record findings.

REVIEW LIST:
1. Mechanical area where refrigeration equipment and water heaters are located check for any water flowing into the floor drains from the many pipes that discharge into those drains.
2. Other hot water heaters (food court, tire center, bathrooms, etc...) check if the pipe from the hot water to the floor drain is discharging water.
3. Inspect location department faucets, hoses, ovens, floor drains, and any water consuming equipment for signs of water discharge (use).
4. Inspect equipment floor drains for water discharge from pipes plumbed to the drain behind the equipment. (Use flash light to look under the equipment at the pipes in back of the equipment as they discharge into the drains; there should be no water flowing).

*Signature*

Save and Send Email

Email Embedded Image Files

DRAG AND DROP FILES
Or select a file

Location Name

HIDE CHART
SHOW EVENTS

FIG. 19C

CARWASH EVENT CALENDAR

FEBRUARY 2016

HOME　SITES　UTILITIES　EVENTS▼　REPORTS▼　STATUS▼

| SUN | MON | TUE | WED | THU | FRI | SAT |
|---|---|---|---|---|---|---|
| 31<br>0024 AM MECH<br>0120 AM MECH<br>0140 AM MECH<br>0401 AM MECH<br>0474 AM MECH<br>+10 MORE | 1<br>0024 AM MECH<br>0140 AM MECH<br>0401 AM MECH<br>0455 AM MECH<br>0474 AM MECH<br>+11 MORE | 2<br>0024 AM MECH<br>0028 AM MECH<br>0140 AM MECH<br>0401 AM MECH<br>0476 AM MECH<br>+10 MORE | 3 WEDNESDAY, FEBRUARY 3 ×<br>0024 AM MECH<br>0028 AM MECH<br>0140 AM MECH<br>0401 AM MECH<br>0476 AM MECH<br>0483 AM MECH<br>0540 AM MECH<br>0671 AM MECH<br>0741 AM MECH<br>0775 AM MECH<br>1001 AM MECH<br>1050 AM MECH<br>1205 AM MECH<br>702 AM MECH<br>730 AM MECH<br>732 AM MECH<br>750 AM MECH | 4 | 5 | 6 |
| 7 | 8 | 9 | | 11 | 12 | 13 |
| 14 | 15 | 16 | | 18 | 19 | 20 |
| 21 | 22 | 23 | 24 | 25 | 26 | 27 |

FIG. 20

WATER WASTE EVENTS

START DATE (BLANK IS ALL): 2016-02-03  
END DATE (BLANK IS ALL):  
SITE: ALL  
NODE PURPOSE: ALL  
STATUS: ALL

AUTOMATED EVENT: ALL

CLASS:
- ☐ MANUAL
- ☐ TRIAGE
- ☐ AUTOMATED

SEVERITY:
- ☐ LEVEL 1
- ☐ LEVEL 2
- ☐ LEVEL 3
- ☑ LEVEL 4
- ☑ LEVEL 5
- ☑ LEVEL 6

[SEARCH] [CREATE POWERPOINT]

☐ SHOW EVENTS

| ☐ EVENT DATE | CREATED | SITE | NODE | PURPOSE | CLASS | TYPE | AUTO | STATUS | LEVEL | DURATION | ACTION |
|---|---|---|---|---|---|---|---|---|---|---|---|
| ☐ 2016-02-03 | 04:05 | (0028) | WAREHOUSE MAIN | MAIN | AUTOMATED | MECHANICAL | MECHANICAL 1 | WAITING | 4 | 0 | GO |
| ☐ 2016-02-03 | 04:05 | (750) | BODEGA | OPERATIONS | AUTOMATED | MECHANICAL | MECHANICAL 1 | SENT | 4 | 0 | GO |
| ☐ 2016-02-03 | 02:05 | (702) | BODEGA | OPERATIONS | AUTOMATED | MECHANICAL | MECHANICAL 1 | SENT | 4 | 0 | GO |
| ☐ 2016-02-02 | 15:30 | (0687) | WAREHOUSE MAIN | MAIN | AUTOMATED | OPERATIONAL | OPERATIONAL | CALL | 5 | 2130 | GO |
| ☐ 2016-02-02 | 15:30 | (0119) | WAREHOUSE MAIN | MAIN | AUTOMATED | OPERATIONAL | OPERATIONAL | CALL | 5 | 2884 | GO |
| ☐ 2016-02-02 | 07:45 | (701) | BODEGA | OPERATIONS | AUTOMATED | OPERATIONAL | OPERATIONAL | WAITING | 5 | 2196 | GO |
| ☐ 2016-02-02 | 04:05 | (0028) | WAREHOUSE MAIN | MAIN | AUTOMATED | MECHANICAL | MECHANICAL 1 | SENT | 4 | 0 | GO |
| ☐ 2016-02-01 | 17:15 | (707) | BODEGA | OPERATIONS | AUTOMATED | OPERATIONAL | OPERATIONAL | SENT | 4 | 834 | GO |
| ☐ 2016-02-01 | 15:15 | (0687) | WAREHOUSE MAIN | MAIN | AUTOMATED | OPERATIONAL | OPERATIONAL | CALL | 5 | 2714 | GO |
| ☐ 2016-02-01 | 15:00 | (0640) | WAREHOUSE MAIN | MAIN | AUTOMATED | OPERATIONAL | OPERATIONAL | SENT | 4 | 878 | GO |
| ☐ 2016-02-01 | 14:30 | (732) | BODEGA | OPERATIONS | AUTOMATED | OPERATIONAL | OPERATIONAL | WAITING | 4 | 2005 | GO |
| ☐ 2016-02-01 | 14:30 | (0119) | WAREHOUSE MAIN | MAIN | AUTOMATED | OPERATIONAL | OPERATIONAL | CALL | 5 | 3268 | GO |
| ☐ 2016-02-01 | 13:45 | (720) | BODEGA | MAIN | AUTOMATED | OPERATIONAL | OPERATIONAL | CALL | 5 | 2360 | GO |
| ☐ 2016-02-01 | 13:15 | (721) | BODEGA | OPERATIONS | AUTOMATED | OPERATIONAL | OPERATIONAL | SENT | 5 | 2110 | GO |
| ☐ 2016-02-01 | 12:45 | (726) | BODEGA | OPERATIONS | AUTOMATED | OPERATIONAL | OPERATIONAL | CALL | 5 | 2663 | GO |
| ☐ 2016-02-01 | 10:30 | (701) | BODEGA | OPERATIONS | AUTOMATED | OPERATIONAL | OPERATIONAL | SENT | 5 | 1859 | GO |
| ☐ 2016-02-01 | 10:15 | (705) | BODEGA | OPERATIONS | AUTOMATED | OPERATIONAL | OPERATIONAL | SENT | 5 | 555 | GO |
| ☐ 2016-02-01 | 10:00 | (702) | BODEGA | OPERATIONS | AUTOMATED | OPERATIONAL | OPERATIONAL | CALL | 5 | 3633 | GO |

FIG. 21

HOME    SITES    UTILITIES    EVENTS▼    REPORTS▼    STATUS▼    LOGOUT

LANGUAGE
MECHANICAL EVENT TEXT    [ENGLISH ◆]

| LEVEL 1 MECHANICAL EVENT | |
|---|---|
| ISSUES AND NOTES | INITIAL RECOMMENDATION |
| #RANGE - AT OR ABOVE 0.1 GAL/MIN UP TO 0.5 GAL/MIN | RECOMMENDATION: ON YOUR NEXT FLOOR WALK, USE THE ATTACHED IMAGE AND REVIEW LIST BELOW TO DO A QUICK REVIEW OF THE MOST LIKELY CAUSES. |
| #COMPARABLE TEXT: 'X' KITCHEN SINK (ONE KITCHEN SINK = 2.5 GAL/MIN) | IF YOU DO NOT FIND THE PROBLEM QUICKLY, HAVE THE NIGHT MANAGER USE THE IMAGE AND INSTRUCTIONS TO DO A MORE DETAILED INSPECTION FOR WATER |
| #1AM TO 5PM FOR MECHANICAL - MORNING REPORT TWICE, THEN EMAIL | WASTE WHEN CONDUCTING THEIR FINAL WALK THROUGH. THEY WILL NEED A STRONG FLASHLIGHT AND ABOUT 10 MIN OF EXTRA TIME TO LOOK AND |
| #SUBJECT LINE | RECORD FINDINGS. |
| [10XX WHS_NAME] - X GAL/MIN WATER WASTE ([X*1440] GALLONS PER DAY) | BEST REGARDS, |

| REFRESHED: 1/4/2016 10:41:51 | | | | | | | |
|---|---|---|---|---|---|---|---|
| GW CLOCK OFF | | | | | | | |

| NUM | SITE | NODE | MACID | IP | RSSI | M1TIME | M2TIME | M3TIME | M4TIME |
|---|---|---|---|---|---|---|---|---|---|

ZEROES

| NUM | SITE | NODE | MACID | IP | RSSI | TOTAL |
|---|---|---|---|---|---|---|
| 1## | NAME 1 | NODE TYPE #1 | 1#:##:##:##:##:## | 1#.###.###.### | -69.00 | 245 |

V1 GATEWAYS

| NUM | SITE | MACID | IP | LAST RSSI | DB TIMESTAMP | MIN | UPTIME |
|---|---|---|---|---|---|---|---|
| 2## | NAME2 | 2#:##:##:##:##:## | 2#.###.###.### | -73.00 | 2016-02-03 09:11:26 | 01:30:25 | 4 DAYS 118:27:00 |
| 3## | NAME3 | 3#:##:##:##:##:## | 3#.###.###.### | -63.00 | 2016-01-30 11:15:36 | 3 DAYS 23:26:15 | 00:03:00 |
| 4## | NAME4 | 4#:##:##:##:##:## | 4#.###.###.### | -67.00 | 2016-01-29 04:31:52 | 5 DAYS 06:09:58 | 8 DAYS 23:28:00 |
| 5## | NAME5 | 5#:##:##:##:##:## | 5#.###.###.### | -67.00 | 2016-02-02 08:31:21 | 1 DAY 02:10:30 | 02:19:04 |

0.9 GATEWAYS

| NUM | SITE | GWADDR | IP | DB TIMESTAMP | MIN | UPTIME | TOTAL1 | TOTAL2 |
|---|---|---|---|---|---|---|---|---|
| 6## | NAME6 | 6###### | | 2016-02-03 01:01:31 | 09:40:21 | 195 DAYS 20:27:05 | 6290293 | 10639 |
| 7## | NAME7 | 7##### | | 2016-02-02 10:26:41 | 1 DAY 00:15:10 | 216 DAYS 21:33:18 | 1773077 | 3 |

| EVENT DATE | CREATED | SITE | NODE | PURPOSE | CLASS |
|---|---|---|---|---|---|
| 2016-02-03 | 09:43 | LOCATION #1 | NODE TYPE #1 | IRRIGATION | MANUAL |
| 2016-02-03 | 09:38 | LOCATION #2 | NODE TYPE #2 | COOLING TOWER | MANUAL |
| 2016-02-03 | 08:43 | LOCATION #3 | NODE TYPE #3 | MAIN | MANUAL |
| 2016-02-03 | 06:05 | LOCATION #4 | NODE TYPE #3 | MAIN | AUTOMATED |
| 2016-02-03 | 04:05 | LOCATION #3 | NODE TYPE #3 | OPERATIONS | AUTOMATED |
| 2016-02-03 | 04:05 | LOCATION #5 | NODE TYPE #4 | OPERATIONS | AUTOMATED |
| 2016-02-03 | 04:05 | LOCATION #6 | NODE TYPE #5 | OPERATIONS | AUTOMATED |
| 2016-02-03 | 02:05 | LOCATION #7 | NODE TYPE #4 | OPERATIONS | AUTOMATED |
| 2016-02-03 | 02:05 | LOCATION #8 | NODE TYPE #4 | OPERATIONS | AUTOMATED |
| 2016-02-03 | 02:05 | LOCATION #9 | | | AUTOMATED |

2300

| EVENT DATE | CREATED | SITE | NODE | PURPOSE | CLASS |
|---|---|---|---|---|---|
| 2016-02-03 | 09:43 | LOCATION #1 | NODE TYPE #1 | IRRIGATION | MANUAL |
| 2016-02-03 | 09:38 | LOCATION #2 | NODE TYPE #2 | COOLING TOWER | MANUAL |
| 2016-02-03 | 08:43 | LOCATION #3 | NODE TYPE #3 | MAIN | MANUAL |
| 2016-02-03 | 06:05 | LOCATION #4 | NODE TYPE #3 | MAIN | AUTOMATED |
| 2016-02-03 | 04:05 | LOCATION #3 | NODE TYPE #3 | MAIN | AUTOMATED |
| 2016-02-03 | 04:05 | LOCATION #5 | NODE TYPE #4 | OPERATIONS | AUTOMATED |
| 2016-02-03 | 04:05 | LOCATION #6 | NODE TYPE #5 | OPERATIONS | AUTOMATED |
| 2016-02-03 | 02:05 | LOCATION #7 | NODE TYPE #4 | OPERATIONS | AUTOMATED |
| 2016-02-03 | 02:05 | LOCATION #8 | NODE TYPE #4 | OPERATIONS | AUTOMATED |
| 2016-02-03 | 02:05 | LOCATION #9 | NODE TYPE #4 | OPERATIONS | AUTOMATED |

FIG. 23B

LOW POWER, CENTRALIZED DATA COLLECTION

CROSS REFERENCE TO RELATED APPLICATIONS

This is a continuation application which claims priority to commonly assigned, co-pending U.S. patent application Ser. No. 15/423,500, filed Feb. 2, 2017, which claims priority filing benefit from U.S. Provisional Patent Application Nos. 62/292,147, filed Feb. 5, 2016, and 62/432,431, filed Dec. 9, 2016. Application Ser. Nos. 15/423,500, 62/292,147 and 62/432,431 are fully incorporated herein by reference.

BACKGROUND

Resource monitoring systems use various types of sensors to gather resource measurement data to monitor resource consumption for industrial, commercial and residential uses. As the techniques for monitoring resource consumption continue to evolve, the use of end computing devices to provide additional functionality to unsophisticated sensors has become more commonplace. For example, rather than requiring manual, human-based collection of resource measurement data from sensors placed in geographically disparate locations to determine resource consumption, end computing devices may report resource measurement data to centralized locations using wired and/or wireless communications. Due to the nature of the types of resources being monitored, these end devices and associated sensors may be placed in remote or difficult to access locations. Consequently, it is advantageous for these end computing devices to transmit resource measurement data over longer distances.

Remote or otherwise inaccessible end devices may be coupled to sensors in locations where external power supplies are not readily available, thereby requiring the use of internal power supplies, such as battery power. As the distance end devices transmit resource measurement data increases, so does the drain on these internal supplies, which results in requiring for more frequent manual replacement of internal power supplies, which is time and cost intensive. Thus, users of end computing devices in resource monitoring systems experience a trade-off between transmission distance and longevity of internal power supplies.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

FIG. 15 illustrates the small form factor of a concentrator relative to a quarter to give reference as to the small size of the concentrator.

FIG. 16 is an example graphical user interface (GUI) that illustrates a suspected event report and/or alert. A service provider may generate the GUI based on data received from an end device or a gateway device.

FIGS. 19A-19D are GUIs that illustrate an automated waste event tracking system. The GUIs provide an interface for a service provider to generate a report for one or more customers and provide recommendations to the one or more customers.

FIG. 20 is a GUI illustrating an analytics log for detected waste events. A service provider may generate the GUI based on data received from an end device or a gateway device.

FIG. 21 is a GUI illustrating an automated alert tracking page for providing a user with capabilities to track alerts provided by a service provider.

FIG. 22 is a GUI illustrating an interface for a service provider to generate and manage alerts for a monitored location.

FIGS. 23A and 23B are GUIs illustrating information and anomalies regarding resource consumption information for a monitored site.

DETAILED DESCRIPTION

Figure 1:
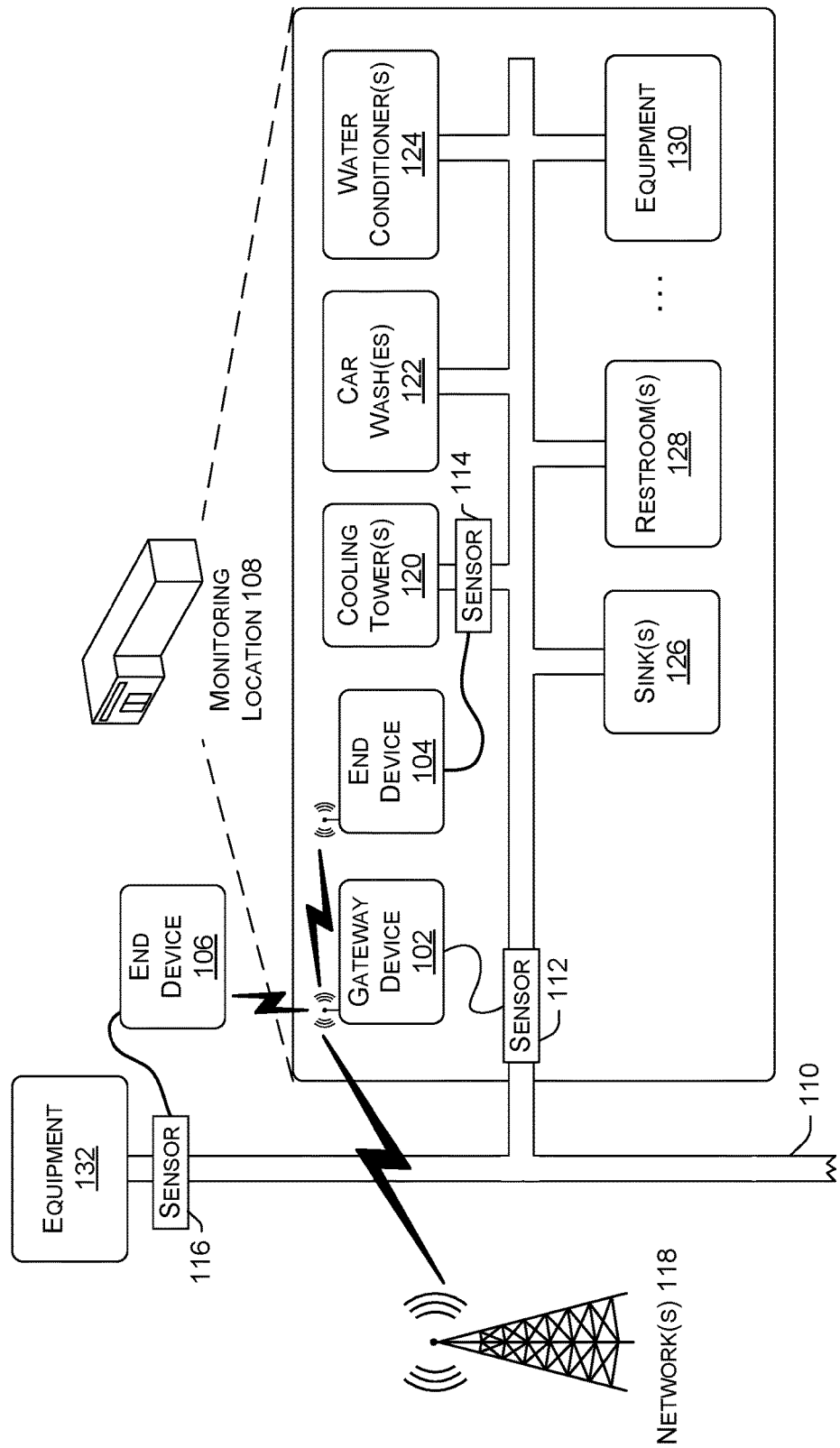
FIG. 1 illustrates an example environment including an end device coupled to one or more sensors collecting resource measurement data, and a gateway device receiving the resource measurement data from the end device over one or more networks.

Embodiments of this disclosure are directed to techniques for improving battery life performance of end devices in resource monitoring systems which transmit data using low-power wide area network (LPWAN) technologies. Further, embodiments described herein include techniques for providing end devices configured to interface with multiple types of sensors, thereby increasing the functionality, versatility, and interchangeability of the end devices. Additionally, the embodiments described contemplate techniques for reducing the size of a concentrator of a gateway device of resource monitoring systems which receive resource measurement data from the end devices. Reducing the size of the concentrator of gateway devices may result in smaller, more compact gateway devices that consume less energy by reducing heat dissipation experienced in gateway devices with larger concentrators. Additionally, reducing the size of the concentrator also allows for use in mobile applications (e.g., mounted on an unmanned aerial vehicle). Further, reducing the concentrator size may allow the concentrator to be implemented into existing form factors that allow the concentrator to be plugged into open hardware sockets for increased functionality.

Resource monitoring systems may include networks of devices, such as one or more end devices coupled to sensors to monitor resources at monitoring locations and to transmit resource measurement data to one or more gateway devices. In various examples, the end devices may transmit resource measurement data using LPWAN technologies (e.g., LoRaWAN®, GREENWAVE®, etc.) to provide low-power communications over longer distances than the communications provided using short-range wireless communication technologies (e.g., ZIGBEE®, BLUETOOTH®, etc.).

In some examples, the end devices may be located such that external power supplies are unavailable, and may be powered using an internal power supply (e.g., batteries, battery banks, etc.). Depending on the distance the end device must transmit the resource measurement data, the signals carrying the data may be relatively high power signals (e.g., ½-watt, 1-watt, etc.). In various examples, however, peak current provided by internal batteries may be insufficient for an end device to transmit high power signals. Techniques described herein contemplate the use of a supercapacitor to provide sufficient power for these relatively high power communications. In some examples, batteries of the end device may provide power to the system components (e.g., microprocessor, voltage converters, etc.), whereas the supercapacitor may provide power to the transceiver for the relatively high power transmissions. In some examples, the end device may periodically transmit the resource measurement data. In such examples, the supercapacitor may only supply power to the transceiver and/or transceiver components while in a communication mode for small periods of time (e.g., 10 milliseconds, 100 milliseconds, etc.), and remain in a low power mode for longer periods of time (e.g., 30 seconds, 1 minute, 5 minutes, etc.). In some examples, the supercapacitor may at least partially discharge when providing power to the transceiver in communication mode. Once the supercapacitor has finished supplying power to the transceiver to transmit a signal, the batteries may recharge the supercapacitor during the lower power mode for the longer periods of time to charge the supercapacitor for the next transmission. In this way, the end devices may receive and store resource measurement data from sensors using battery power while in the lower power mode, and transmit the resource consumption data periodically using relatively high power signals powered by the supercapacitor.

In some examples, the end device may include a gas gauge having a coulomb counter. The coulomb counter may count the coulombs (e.g., ampere-second) leaving the batteries to charge the supercapacitor during the low power mode to determine how much energy is leaving the batteries and/or how much energy remains in the batteries. In some examples, the gas gauge may limit the amount of current leaving the batteries from going above a threshold coulomb count to prevent the batteries from discharging too quickly when charging the supercapacitor. In some examples, this may extend the life of the batteries.

In various examples, the end device may include a sensor interface configured to interface with multiple types of sensors. For example, the sensor interface may allow the end device to receive data from multiple types of sensors, including 3-wire Automatic Meter Reading (AMR) sensors, Hall effect sensors, reed switch sensors, Pulses sensors, and magneto-resistive sensors. In various examples, the sensor interface may include a single connection which is configured to accept inputs from all the above sensors (e.g., using multiple ports) and collect data from the sensors using the single connection. In this way, the end device may provide additional functionality, versatility, and complete interchangeability between a plurality of sensor types.

In some examples, the end device may have a duty cycle by which data collection circuits or modules are powered on to receive resource measurement data from the sensors, and powered down to conserve battery power. In some instances, the duty cycle may be fixed or predefined for the end device upon manufacture and/or installation. In various examples, the end device may include one or more modules, circuits, and/or algorithms configured to dynamically modify the duty cycle by which the end device receives sensor data through the port of the sensor interface. As an example, the end device may determine a type of sensor that is providing data to the end device through the sensor interface. In some examples, the end device may receive an indication of the type of sensor in various ways. For example, the end device may receive an indication of the sensor type over a network from one or more server computing devices, or from another computing device via a cable connected to another input port of the end device (e.g., Universal Serial Bus (USB) port, Universal Asynchronous Receiver/Transmitter (UART) port, etc.). In some examples, the end device may cycle through the sensor types to determine which type of sensor is providing data through the sensor interface, or infer the sensor type based on a format or type of data received from the sensor.

As noted above, the duty cycle by which data collection and storage circuits or modules of the end device are powered on to receive resource measurement data from the sensors, and powered down to conserve battery power, may be dynamically modified based on the type of sensor. For example, the end device may calculate, or receive over the network from server computing devices, an updated duty cycle. The updated duty cycle may be based on various parameters of the type of sensor, such as a rotational speed of the sensor, a rate at which the sensor outputs pulses, etc. In various examples, by dynamically changing the duty cycle, the power down time periods of the duty cycle may be extended, which thereby saves battery power, while ensuring that the data collection and storage components and circuits are powered on at the appropriate times to maintain efficient data collection and storage (e.g., to prevent "dropping" of measurements).

In some examples, a gateway device may include a concentrator which has small form factor. For example, the concentrator may have dimensions of approximately 1.3"× 0.96"×0.19" resulting in a total volume of approximately 0.24 in$^3$. In some examples, the small size of the concentrator may require efficient use of power and result in less heat dissipated from the concentrator due to losses. In some examples, the concentrator may comply with the XBee® interface standard. Further, the concentrator may include two radios with antennas to allow for simultaneous dual channels or diversity operation, with both antennas listening to the same channel. In some examples, both radios are configured to transmit signals at a power of 1-watt simultaneously at differing frequencies.

In various embodiments, the techniques and/or systems described herein can improve a functioning of end devices by reducing an amount of battery power consumed by end devices and/or gateway collection devices. Further, despite reduced power consumption and increased battery life, the techniques and/or systems described herein enable high-resolution transmission of resource data (e.g., every second, minute, etc.). Thus, the systems and methods improve equipment operation, save battery life, provide high power transmission of signals, and maintain functionality for end devices and gateway collection devices, among other benefits.

Example Architectures

FIG. 1 illustrates an example environment 100 including one or more gateway devices 102 to receive resource measurement data from one or more end devices 104 and 106 for monitoring resources at a monitoring location 108, in accordance with embodiments of the disclosure.

In some embodiments, the monitoring location 108 can represent a warehouse, grocery store, restaurant, car wash, office building, residence, oil refinery, agricultural installation (e.g., a farm), shipping location, or any location that uses one or more resources, such as resource 110. As can be understood in the context of this disclosure, the resource 110 can include one or more resources such as water, electricity, air, fuel (gasoline, diesel, kerosene, etc.), or the like, and in some embodiments, can include inputs and/or outputs to and from the monitoring location 108. For example, the resource 110 can represent clean or potable water and/or waste water.

The monitoring location 108 can include one or more gateway devices 102 and one or more end devices 104 and 106, which are operatively coupled with one or more sensors, 112, 114, and 116, respectively. As illustrated in FIG. 1, the sensor 112 provides input to the gateway device 102, the sensor 114 provides input to the end device 104, and the sensor 116 provides input to the end device 106. In some embodiments, each piece of equipment (also referred to as a node) may include a sensor to monitor the resources for each individual node. In some embodiments, one or more sensors can be coupled with an individual gateway device or an individual end device. In some embodiments, the end devices 104 and 106 can wirelessly communicate with the gateway device 102, which in turn can wirelessly communicate with network(s) 118. In some embodiments, the gateway device 102 can communicate directly with the network(s) 118. In some embodiments, the gateway device 102 and the end devices 104 and 106 can form a mesh network, with the gateway device 102 providing a communication interface with the network(s) 118. In some embodiments, the gateway device 102 and the end devices 104 and 106 can communicate with the network(s) 118 via channels not provided on a network or communication means provided by the monitoring location 108. That is to say, the gateway device 102 and the end devices 104 and 106 can communicate with the network(s) 118 independently from the monitoring location 108 to reduce network congestion and to improve network security. In some embodiments, the gateway device 102 and the end devices 104 and 106 can communicate with the network(s) 118 via any wired or wireless connections. The gateway device 102 and the end devices 104 and 106 are also discussed in connection with the various figures of the disclosure, below.

The monitoring location 108 can include, but is not limited to, one or more pieces of equipment (or nodes) such as cooling tower(s) 120 (e.g., evaporative cooling processes and/or systems), car wash(es) 122, water conditioner(s) 124, sink(s) 126, restroom(s) 128, and/or equipment 130 and 132, such as heaters, computers, televisions, mobile phones, lights, pumps, buildings, irrigation, electrical, gas, HVAC, programmable logic controllers, sensors, etc. As can be understood in the context of this disclosure, the monitoring location 108 can represent any type of business, government, industrial, institutional, school, hospital, land scape, agricultural, and/or residential facility, and can include any associated equipment 130 and 132. Further, the monitoring location 108 can include additional sensors for monitoring or measuring an occupancy of the monitoring location 108, environmental sensors for monitoring or measuring temperature, humidity, pressure, conductivity of resources, chemical composition (e.g., pH) of resources, or weather at the monitoring location 108, and/or a security system at the monitoring location.

In some embodiments, the equipment 132 can be located outside of the monitoring location 108, and can be located in a separate building, above ground, or below ground. In some embodiments, the equipment 132 can monitor a same or a separate resource as the resource 110. As described in connection with the various figures of this disclosure, the equipment 132 can be located at a site where hard wired power is not available, or where it is not practical or economical to provide power (e.g., in a field, underground, in a well, etc.). In some embodiments, the end device 106 can use battery power and low power transmitters and receivers to communicate with the gateway device 102. In such a case, this implementation can reduce installation costs at the monitoring location 108.

In some embodiments, one or more sensors 112, 114, and 116 can be used to monitor resources consumed at the monitoring location 108. For example, each piece of equipment can be associated with a unique sensor, while in some embodiments, only one sensor can be used, to monitor a water main or electrical main, for example. In some embodiments, multiple types of resources can be monitored at the monitoring location, such as water and electricity consumption. In some embodiments, data from multiple sensors can be combined and/or analyzed together to generate a virtual node with an associated resource consumption. For example, telemetry data from the cooling tower(s) 120 provided by the sensor 114 can be used to remove the effect of the cooling tower(s) 120 on the resource consumption monitored by the sensor 112. In some embodiments, multiple sensors can be used to increase a resolution of data provided by the systems and methods described herein. In some embodiments, data from multiple sensors can be determined and correlated to provide insight into operations at the monitoring location 108. For example, the occupancy of the monitoring location 108 can be determined along with water and/or electricity usage to determine operational and/or mechanical waste and/or to determine when a resource consumption is within operating procedures. In another example, a conductivity or pH of water in an evaporative cooling system can be monitored in conjunction with water and/or electricity usage to determine operational and/or mechanical waste and/or to determine when a resource consumption is within operating procedures. In another example, water temperature is monitored to verify within limits for proper handwashing (e.g., for food handlers, hospitals, etc.). In another example, air temperature is monitored to ensure freezers and refrigerators within limits for food safety and to maximize storage time and minimize waste.

In some embodiments, the resource consumption can be normalized using a variety of factors, such as location size, location capacity, location productivity, number of persons, number of objects produced, etc. For example, these normalization factors can be monitored by the gateway device 102, the end device(s) 104 and 106, or additional equipment at the monitoring location 108, and/or the normalization factors can be obtained from a third-party. For example, to monitor customer traffic at a location, the monitoring location 108 and/or the gateway device 102 can include a video camera counting a number of unique faces at the monitoring location 108, thereby providing an accurate count of the number of individuals (or number of individuals per minute, hour, etc.) at the monitoring location. By way of another example, weather information can be obtained from public or private weather sources, such as the Internet.

Figure 2:
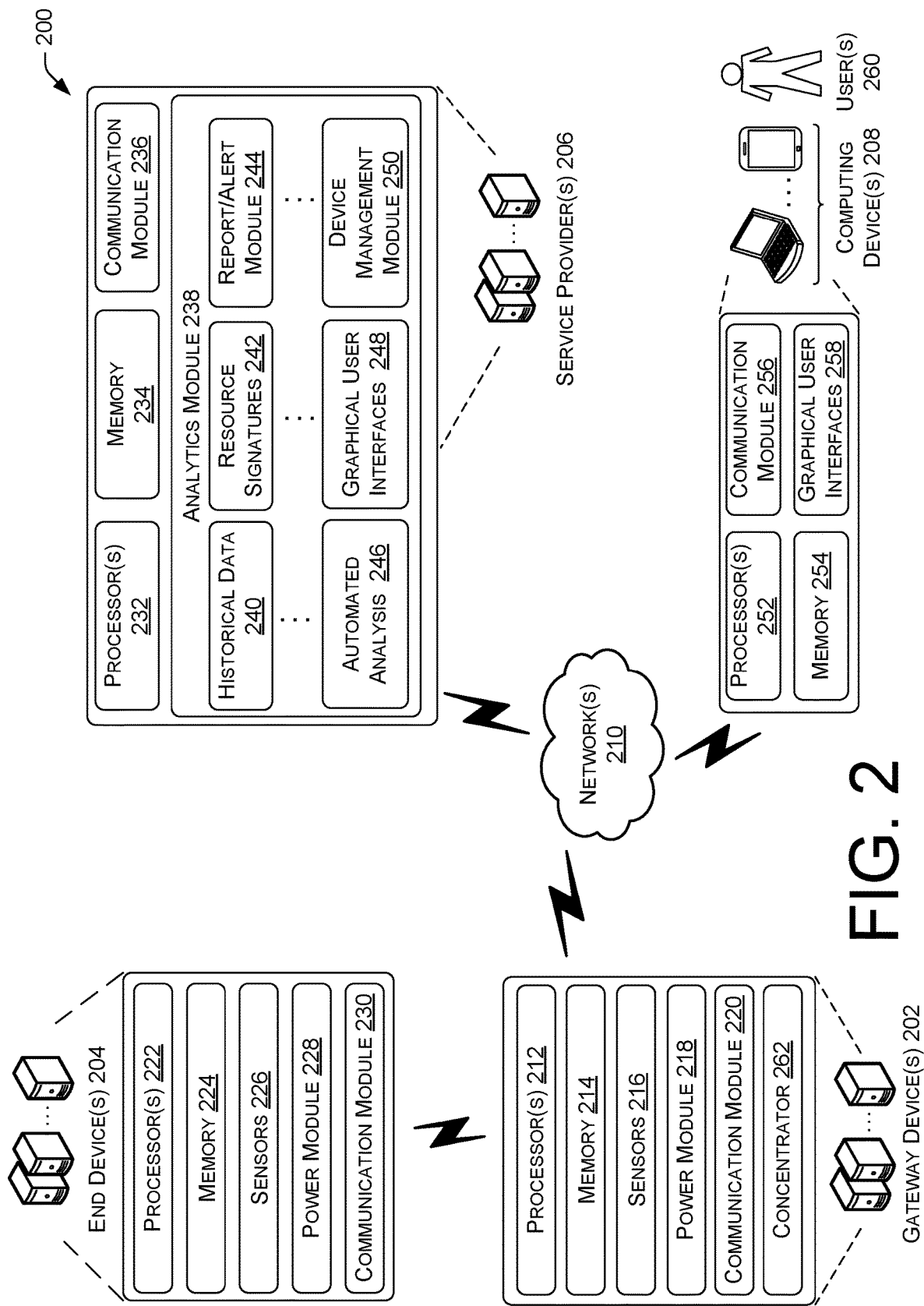
FIG. 2 illustrates an example environment including end device(s), gateway device(s), service provider(s), and computing device(s), for collecting resource data and monitoring resources.

FIG. 2 illustrates an example environment 200 including one or more gateway devices 202, one or more end devices 204, one or more service providers 206, and one or more computing devices 208, for collecting resource data and monitoring resources.

The example environment 200 is usable to implement the techniques and systems described herein. The environment 200 includes a plurality of devices such as gateway device(s) 202 and end device(s) 204 configured to gather and process data described herein. The environment 200 also includes one or more service provider(s) 206 that can further provide processing and analytics. The service provider(s) 206 is configured to communicate alerts, reports, analytics, graphical user interfaces, etc., to the computing device(s) 208 and/or the gateway device 202, for example. In various examples, the gateway device(s) 202, the end device(s) 204, the service provider(s) 206, and the computing device(s) 208 can communicate via one or more networks 210.

The gateway device(s) 202 can individually include, but are not limited to, any one of a variety of devices, including portable devices or stationary devices. For instance, a device can comprise a data logger, an embedded system, a monitoring device, a smart phone, a mobile phone, a personal digital assistant (PDA), a laptop computer, a desktop computer, a tablet computer, a portable computer, a server computer, or any other electronic device.

The gateway device(s) 202 can include one or more processor(s) 212 and memory 214. The processor(s) 212 can be a single processing unit or a number of units, each of which could include multiple different processing units. The processor(s) 212 can include a microprocessor, a microcomputer, a microcontroller, a digital signal processor, a central processing unit (CPU), a graphics processing unit (GPU), a security processor etc. Alternatively, or in addition, some or all of the techniques described herein can be performed, at least in part, by one or more hardware logic components. For example, and without limitation, illustrative types of hardware logic components that can be used include a Field-Programmable Gate Array (FPGA), an Application-Specific Integrated Circuit (ASIC), an Application-Specific Standard Products (ASSP), a state machine, a Complex Programmable Logic Device (CPLD), other logic circuitry, a system on chip (SoC), and/or any other devices that perform operations based on instructions. Among other capabilities, the processor(s) 212 can be configured to fetch and execute computer-readable instructions stored in the memory.

The memory 214 can include one or a combination of computer-readable media. As used herein, "computer-readable media" includes computer storage media and communication media.

Computer storage media includes volatile and non-volatile, removable and non-removable media implemented in any method or technology for storage of information, such as computer-readable instructions, data structures, program modules, or other data. Computer storage media includes, but is not limited to, phase change memory (PRAM), static random-access memory (SRAM), dynamic random-access memory (DRAM), other types of random access memory (RAM), read only memory (ROM), electrically erasable programmable ROM (EEPROM), flash memory or other memory technology, compact disk ROM (CD-ROM), digital versatile disks (DVD) or other optical storage, magnetic cassettes, magnetic tape, magnetic disk storage or other magnetic storage devices, or any other medium that can be used to store information for access by a computing device.

In contrast, communication media includes computer-readable instructions, data structures, program modules, or other data in a modulated data signal, such as a carrier wave. As defined herein, computer storage media does not include communication media.

The memory 214 can include an operating system configured to manage hardware and services within and coupled to a device for the benefit of other modules, components and devices. In some embodiments, the one or more gateway device(s) 202 can include one or more servers or other computing devices that operate within a network service (e.g., a cloud service), or can form a mesh network, etc. The network(s) 210 can include the Internet, a Mobile Telephone Network (MTN), Wi-Fi, cellular networks, mesh networks, and/or other various communication technologies.

The techniques discussed above can be implemented in hardware, software, or a combination thereof. In the context of software, operations represent computer-executable instructions stored on one or more computer-readable storage media that, when executed by one or more processors, configure a device to perform the recited operations. Generally, computer-executable instructions include routines, programs, objects, components, data structures, and the like that perform particular functions or implement particular abstract data types.

The gateway device(s) 202 can, at its simplest, include no sensors. Alternatively, the gateway devices(s) 202 can include one or more sensors 216, including but not limited to, a water meter, an electrical meter, a gas meter, a heating, ventilation, and air conditioning (HVAC) sensor/monitor, and/or any generic or specialized sensor input. The sensors 216 can continuously or periodically monitor data at any interval, or upon request. In some embodiments, the gateway device(s) 202 can include one or more expansion ports to receive additional sensors or to receive additional sensor data. In some embodiments, the sensors 216 receive one or more pulses or data from a sensor integrated with a plant utility, such as a water sensor in-line with a water main in a building. In some embodiments, one or more inputs and/or sensors 216 can be optically isolated to protect the gateway device(s) 202 from damaging inputs.

The gateway device(s) 202 can also include a power module 218 that receives power from a network such as a power grid, and can also include one or more uninterruptable power supplies (UPS) to power the gateway device(s) 202 when the power grid is interrupted. For example, the power module 218 can include a timer that determines a condition when power has been absent for too long and can shut down the gateway device(s) 202 without crashing, damaging, or losing data of the gateway device(s) 202. In some embodiments, the power module includes one or more power filters. In some embodiments, the power module 218 can monitor a power supply while the gateway device(s) 202 is in a powered-down state and can restart the device when power is restored. In some embodiments, the power module 218 can send an error message when a power outage is detected. In some embodiments, the power module 218 can provide enough power after power loss to allow for continued transmission of sensor 216 data and/or continued communications with end device 204 or over network(s) 210.

The gateway devices(s) 202 can include a communication module 220 to communicate with other gateway devices or end devices (e.g., in mesh network) and/or to communicate via the network(s) 210. For example, the communication module 220 can include antennas to communicate with the end device(s) 204 via any low power, long range wide area network. In some embodiments, the communication module 220 can negotiate with the end device 204 to determine an optimal radio link to maximize the battery life of the end device 204, for example. These and further aspects of the communication module 220 are described in connection with the various figures of this disclosure. In some examples, the gateway device(s) 202 may further include a concentrator 262 including two independent radio frequency paths, each with transmit and receive capability. In some examples, the concentrator 262 may comply with various standards, such as the XBee® interface standard and allows for cohabitation with other radios, including ISM, cellular, and Wi-Fi. Further discussion of details of the concentrator 262 can be found in the description of FIGS. 12-15.

In some embodiments, the gateway device(s) 202 can include one or more displays, LEDs, buzzers, and/or speakers to provide visual or audio interfaces (e.g., with text-to-speech capabilities) to present the alerts and/or reports discussed herein to a user located at the gateway device 202. For example, the user can interact with the gateway device 202 to review the alerts, reports, recommendations, etc., and implement measures to reduce waste at the site. After addressing or resolving an issue, the user can interact with the gateway device 202, either directly (e.g., via a touchpad display, on-board buttons, keyboard, microphone, etc.) or through the cloud (e.g., smart phone app, web server, etc.) to indicate a state of the issue, for example, whether the issue was resolved, whether the recommendation was helpful, whether the issue was not resolved, etc. In some embodiments, after receiving the indication at the gateway device 202, the indication can be transmitted to the service provider 206 for review and incorporation into the analytics, reports, recommendations, etc.

The end device(s) 204 can include one or more processor(s) 222, a memory 224, sensors 226, a power module 228, and a communication module 230, each of which can be implemented similar to the processor(s) 212, the memory 214, the sensors 216, the power module 218, and/or the communication module 220 of the gateway device(s) 202. In some embodiments, the end device 204 can operate remotely from gateway device 202, for example, at the bottom of a well. In such an example, the end device 204 can monitor a pump, or the like. In some embodiments, the sensor 226 can include a 3-wire Automatic Meter Reading (AMR) unit (coupled with a sensor or protocol provided by SENSUS, NEPTUNE, and/or K-FRAME, for example), an interface with a Hall effect/magnetoresistive sensor, an inductive-capacitive (LC) sensor, and/or a pulse sensor interface. In some embodiments, the power module 228 can include a lithium battery, such as a lithium-thionyl chloride (Li—SOCl$_2$) battery. In some embodiments, the communication module 230 can communicate with the gateway device 202 via one or more antennas, communicating at within one or more industrial, scientific, and medical (ISM) bands, such as 915 MHz in the United States, 868 MHz/433 MHz in Europe, 430 MHz in Australia, 923 MHz in Japan, etc., for example, in accordance with the particular protocol and/or particular implementation location. In some embodiments, the communication module 230 can be configured in accordance with various operating region requirements. In some embodiments, the end device 204 can transmit and receive data via a long range, wide area network, for example, in accordance with a LoRa modulation protocol provided by SEMTECH, or in accordance with the LoRaWAN specification provided by the LoRa Alliance. In some embodiments, the communication module 230 includes a GFSK (Gaussian Frequency Shift Keying) or FSK (Frequency Shift Keying) link capability. In some embodiments, the communication module 230 can communicate via any one of IEEE 802.11, Wi-Fi, cellular, 3G or 4G LTE networks, LAN, WAN, wired or wireless networks, etc. Further details of the end device 204 and the gateway device 202 are provided in connection with FIGS. 3-15.

The service provider(s) 206 can include one or more processor(s) 232, a memory 234, and a communication module 236, each of which can be implemented similar to the processor(s) 212, the memory 214, and/or the communication module 220 of the gateway device(s) 202.

In some embodiments, the service provider(s) 206 can include an analytics module 238, including one or modules such as a historical data 240 module, a resource signatures 242 module, a report/alert module 244, an automated analysis 246 module, a graphical user interfaces 248 module, and/or a device management module 250.

In some embodiments, the analytics module 238 can receive input regarding resource usage from the gateway device(s) 202 and/or the end device 204 and can analyze the data to generate historical data. Further, the analytics module 238 can receive data and compare the data with historical data to determine a suspected event. In some embodiments, the analytics module 238 can compare current and/or historical data between a plurality of locations. In some embodiments, the analytics module 238 can normalize the current and/or historical data by factors such as site usage, site production, temperature, weather, etc., using data gathered from sensors at the monitoring location and/or gathered from third party sources. In some embodiments, the analytics module 238 can determine mechanical and/or operational waste. In some embodiments, the analytics module 238 can generate one or more signatures indicating a resource usage, such as a correct or incorrect resource usage. In some embodiments, the analytics module 238 can generate one or more reports, alerts, recommendations, and/or graphical user interfaces.

In some embodiments, the service provider performs analytics to map real time and historic resource usage, as well as specific identified events: 1) to a specific alert's subject, text, images, manuals, receiver list, threshold categorization, etc.; and/or 2) for inclusion in historic reports for management, administrators, executives, sustainability reports, compliance reporting, motivational programs, gamification features, etc.

In some embodiments, resource consumption data is combined with metadata (e.g., site specific or node specific operations knowledge, etc.) to create transparency on managerial and operational practices such as compliance with Best Management Practices, Standard Operating Procedures, and managerial success at controlling waste, optimizing resource usage, etc. This same data can also be compared across multiple locations for the purpose of managerial reporting, sustainability program compliance reporting, equipment calibration, actual verses predicted consumption reports, vendor accountability, value engineering, resource dependency relative to sector, compliance reporting, and for staff motivational initiatives such as competitions between sites, gamification of efficient resource use at a given site, between sites, companies, sectors, etc.

For example, in a carwash operation, the high resolution reporting and analytics can automatically compare water use at different parts of the carwash train for a standard vehicle across many locations, the specific site's past tests, manufacturer claims, similar car wash units, industry standards, etc.

In this example, anomalies in the carwash resource usage information trigger event specific responses that are formed by mapping specific subparts of the alert to text, graphics, manuals, customer specific or node specific best management practices and or standard operating procedures. Exemplary alerts, text, graphic, and reports that can be adapted for detailing usage information and specific events are described in connection with FIGS. 16-23B of this disclosure.

In some embodiments, the events and reports are tracked in real time and the data can be used to drive staff motivational initiatives to reward locations for quick resolution of waste events in a recognition mode or gamification mode where points are accrued and reported in a way that allows sites and individuals to compare and compete for optimal resource usage in a gaming and or managerial recognition platform. Metrics such as fewest gallons of water, kwh of electricity, etc. per car washed gain points in the gaming environment as do other corporate and sustainability inputs to create an interactive environment where staff and stakeholders are motivated by gaming and recognition techniques to optimize resource consumption, corporate and sustainability initiatives.

In another example relating to a cooling tower and/or evaporative cooling systems, the high resolution reporting and analytics can automatically compare water use at different loading temperatures, at different water conditions (e.g., conductivity, pH, temperature, pressure, flow rates, etc.), weather conditions, previous operating conditions at the site, other cooling towers of similar capacity operating under similar or varying loading and weather conditions, as well as other metadata to identify specific waste events and opportunities for resource use optimization.

In this cooling tower example, anomalies in the above information trigger event specific responses that are formed by mapping specific subparts of the alert to text, graphics, manuals, customer specific or node specific best management practices and or standard operating procedures. Exemplary alerts, text, graphic, and reports that can be adapted for detailing usage information and specific events are described in connection with FIGS. 16-23B of this disclosure.

The real time and historic data can be used to drive staff motivational initiatives to reward locations for quick resolution of waste events (or optimization innovations submitted) in a recognition mode or gamification mode where points are accrued and reported in a way that allows sites and individuals to compare and compete for optimal resource usage in a gaming and or managerial recognition environment.

In some embodiments, the device management module 250 can monitor the status of the gateway device(s) 202 and/or the end device(s) 204 to determine if the devices are operating within nominal ranges. In the event the devices 202 and/or 204 are indicating a problem (or in response to other feedback from the devices 202 and/or 204), the device management module 250 can generate an alert to investigate the devices. In some embodiments, the device management module 250 can monitor and change the communication and reporting characteristics of the gateway device(s) 202 and end device(s) 204 to minimize power usage. For example, the device management module 250 can control a resolution of data (e.g., data recorded every second, every minute, hourly, weekly, monthly, etc.). In some embodiments, the device management module 250 can set whether devices 202 and 204 are push devices (e.g., the devices initiate communication on their own when data is to be transmitted) or pull devices (e.g., the devices wait for data to be requested by the gateway device(s) 202 or the service provider(s) 206). In some embodiments, the device management module 250 can control transmission power of the device 202 and/or 204.

The computing device(s) 208 can include one or more processor(s) 252, a memory 254, and a communication module 256, each of which can be implemented similar to the processor(s) 212, the memory 214, and/or the communication module 220 of the gateway device(s) 202. Further, the computing device(s) 208 can include graphical user interfaces 258 to display or otherwise present graphical user interfaces at the computing device(s) 208, as described in connection with FIGS. 16-23B.

The environment 200 also includes one or more users 260 to employ the computing device(s) 208. The one or more users 260 can interact with the computing device(s) 208 to perform a variety of operations.

Figure 3:
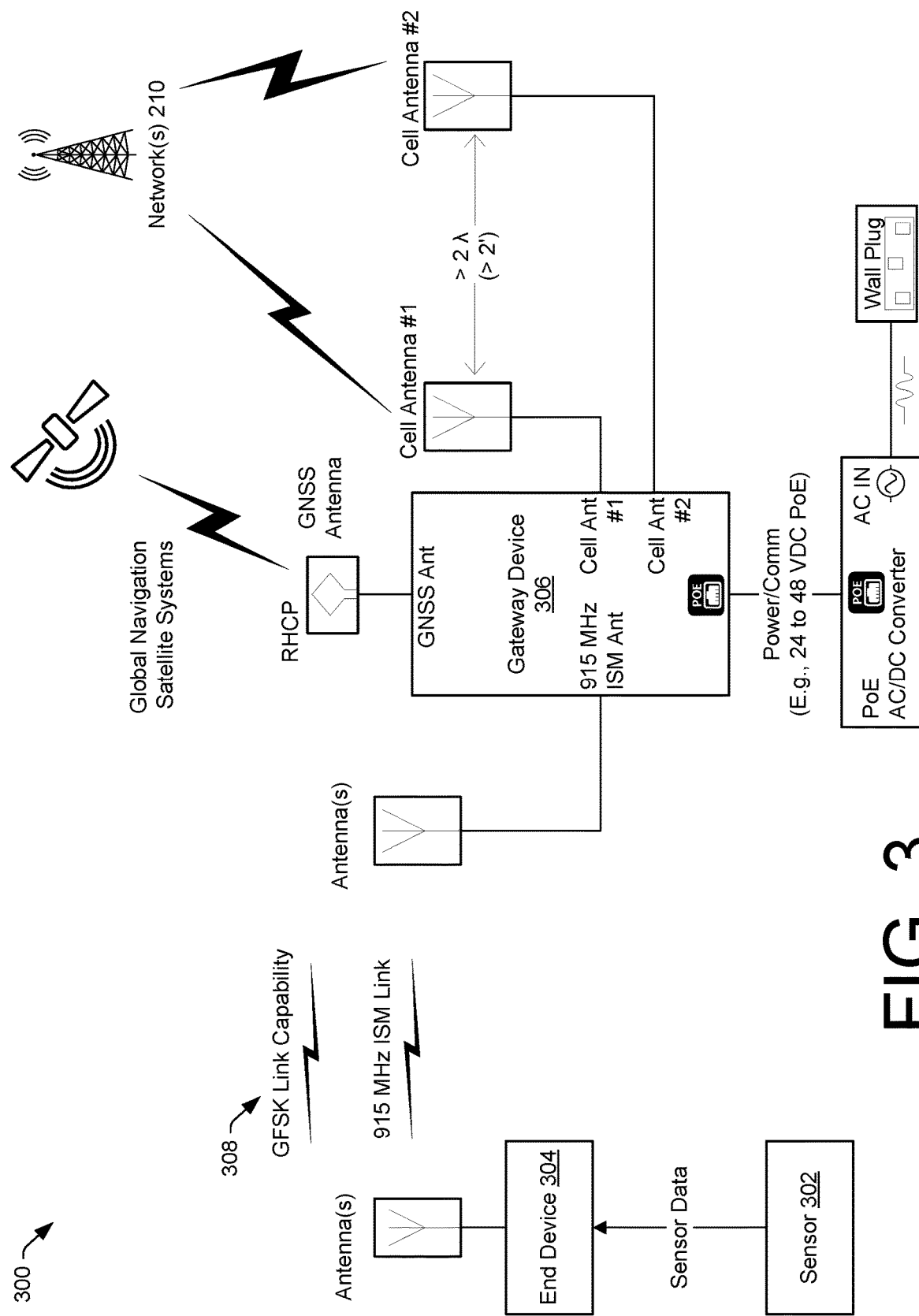
FIG. 3 illustrates a graphic representation of an end device receiving sensor data from a sensor, and transmitting the sensor data to a gateway device.

FIG. 3 illustrates a graphic representation of a system 300 including a sensor 302, an end device 304, and a gateway device 306, for example. The components in FIG. 3 (and throughout the disclosure) are for example purposes only, and the systems, devices, and techniques described herein are not limited to the specific examples, implementations, components, and/or architectures discussed or illustrated herein.

In some embodiments, the end device 304 performs the function of capturing data from its connected sensors, such as the sensor 302. For example, an end device 304 can be connected to a water flow meter and can capture and/or read water flow volume (e.g., total flow, instantaneous flow, flow over a period of time, etc.) passed through the water sensor. This data can be timestamped (e.g., at the end device 304) and can be transmitted (e.g., reported) to the gateway device 306. Exemplary sensor data in the context of water may include but is not limited to, temperature, humidity, pressure, flow rate, conductivity, pH, optical clarity, turbidity, etc. In some embodiments, the end device 304 may be connected to one or more sensors 302 via one or more wired or wireless connections. For example, the connections may include, but are not limited to, one or more of Modbus protocol, M-Bus protocol, Wireless M-Bus protocol, L-Bus protocol, RTH protocol, HART protocol, WirelessHART protocol, ZigBee, Sensus UI-1203 protocol, Neptune ARB V protocol, Neptune ProRead protocol, legacy 2-wire TouchRead protocol, K-Frame protocol, etc., and any protocols or standards discussed herein. In some embodiments, the end device 304 may pull data from the sensor 302, and in some embodiments, the sensor 302 may push data to the end device 304. For example, the end device 304 query a sensor 302 to read one or more registers associated with the sensor 302, or the end device 304 may receive data transmitted by the sensor 302 to the end device 304.

In some embodiments, the end device 304 may function as a repeater for additional end devices. That is, in some instances, an end device may transmit data to the end device 304, which may subsequently transmit the data to the gateway device 306. In some embodiments, the end device 304 may function as a converter for additional end devices or sensors that communicate using company-specific or otherwise proprietary protocols may transmit data to the end device 304, which may subsequently convert nonstandard or proprietary data into a standard or non-proprietary protocol, which may subsequently transmit the data to the gateway device 306.

In some embodiments, communication between the end device 304 and the gateway device 306 can be a radio link using a modulation technique and/or transceiver in compliance with a SEMTECH LoRa modulation technique and/or transceivers. In some embodiments, communication between the gateway device 306 and one or more end devices 304 may be facilitated by a SEMTECH transceiver using LoRa modulation techniques, or by a SEMTECH transceiver using other modulation techniques. In general, the communication between the gateway device 306 and the one or more end devices 304 may include any low-power, long-range, wide area network communication protocol.

In some embodiments, the gateway device 306 can include a data concentrator between one or many end devices 304. One of the functions of the gateway device 306 can be to collect data from each end device, format the data, and transmit the data to one or more service providers. For example, the gateway device 306 can push the data to a service provider (such as the service provider 206), or the data can be pulled from the gateway device 306.

In some embodiments, communications between the gateway device 306 and the service provider 206 can be a cellular connection and can use a 4G LTE CAT 1, CAT 3, or CAT-M1 modem. In some embodiments, communications between the gateway device 306 and the service provider 206 can be a Wi-Fi or other wireless LAN (IEEE 802.11), wired LAN (IEEE 802.3), satellite phone (IRIDIUM), wireless personal area network (WPAN) (IEEE 802.15). Of course, any wired or wireless connection may be used to provide communications between the gateway device 306 and the service provider 206.

In some embodiments, the system 300 may operate in accordance with one or more International Telecommunications Union (ITU) Regions. In some embodiments, the system 300 is operable in ITU Region 1 (e.g., EU868 MHz ISM Band (863 to 870 MHz), including Europe, Africa, the Middle East, and the former USSR); in some embodiments, the system 300 is operable in ITU Region 2 (US915 MHz ISM Band (902 to 928 MHz), including North and South America); and in some embodiments, the system 300 is operable in ITU Region 3 (China 779 to 787 MHz ISM Band, which allows for operation in most of Asia, Indonesia, India, and Australia; AS923 915-928 MHz ISM Band, which allows for operation in Japan, Hong Kong, Taiwan, Singapore, Thailand, and others). To adapt the system 300 disclosed herein to different regions internationally (ITU Region 1, 2, or 3), some embodiments include changing of the RF (radio frequency) components (e.g., surface acoustic wave (SAW) filter, lumped element matching, antenna, etc.) and software reconfiguration. Generally speaking, the system 300 can be adopted to any frequency between 400 MHz to 960 MHz, and can be configured for either LoRa (long range wide area network, such as in accordance with the LoRa Alliance), FSK (frequency shift keying), GFSK (Gaussian frequency shift keying), OOK (on-off keying) modulation, or any low power wide area network modulation techniques.

In some embodiments, the antenna(s) coupled to the end device 304 in FIG. 3 may be one or more 915 MHz ISM antennas that can include a GFSK link capability and/or a 915 MHz ISM link 308. In some embodiments, the end device 304 can include one or more LoRa transceivers including software that is re-configurable for GFSK modes, allowing for compliance with IEEE 802.15.4g (WPAN) and Wireless Meter-Bus (M-Bus) protocol ("WMBus"). In connection with the communication link 308, the LoRa PHY (physical) link RF transmit power, bandwidth (BW), and spreading factor (SF) can be dynamically controlled in software on the end device 304. In some embodiments, the dynamic control can be based upon received-signal-strength indicator (RSSI), signal-to-noise ratio (SNR), packet error rate (PER), or channel activity detection (CAD) to minimize power consumption and maximize range capability without the need to change hardware configuration. In some instances, a communication protocol can be negotiated between the end device 304 and the gateway device 306 based on a number of end devices communicating with the gateway device 306, amount of data to be transmitted, frequency of communication, requested data format, etc. For example, communications protocols may include, but are not limited to, one or more of: a standard compliant with a SEMTECH transceiver; a LoRaWAN® standard; a ZigBee standard; a Bluetooth or Bluetooth Low Energy standard; a haystack standard; an LTE Advanced for Machine Type Communications standard; a MySensors standard; a NarrowBand Internet-of-things (IoT) standard; a NB-Fi standard; an NWave standard; a Random Phase Multiple Access (RPMA) standard; a Senet standard; a Sigfox standard; a Symphony Link standard; a ThingPark Wireless standard; an Ultra Narrow Band (UNB) standard; and a Weightless standard.

In some embodiments, the end device 304 can include flowmeter interfaces (e.g., to interface with the sensor 302). In some embodiments, the flowmeter interfaces include software algorithms and/or hardware control circuitry to dynamically enable and/or disable the external sensors (such as the sensor 302) and flowmeter interfaces to minimize power consumption. In some instances, the flowmeter interfaces may include any wired or wireless protocols. Further, in some instances, the end device 304 may communicate with other end devices, for example, to form a mesh network, a star network, and/or to extend range of communications when an end device 304 is out of range of the gateway device 306.

The gateway device 306 can include one or more antennas, as illustrated in FIG. 3. For example, the gateway device 306 can include one or more 915 MHz ISM antennas, one or more GNSS (Global Navigation Satellite System) Antennas, and one or more cell antennas, such as Cell Antenna #1 and Cell Antenna #2. Although the GNSS Antenna is illustrated as a RHCP (right hand circular polarized) antenna, it may be understood in the context of this disclosure that a linearly polarized antenna can be used as well.

In some embodiments, the GNSS Antenna can receive communications from one or more global navigation satellite systems (GNSS), including GPS (Global Positioning System), GLONASS (Global Navigation Satellite System), Galileo, and/or BeiDou. In order to improve accuracy, in some embodiments, the gateway device 306 can receive communications from a SBAS (satellite-based augmentation system) such as WAAS (wide area augmentation system), EGNOS (European Geostationary Navigation Overlay System), and/or MSAS (MTSAT Satellite Augmentation System). In this manner, the gateway device 306 can be provided with precise position information. Further, this can allow for "open loop installation," whereby an end-customer can install the gateway 306 anywhere without needing to inform a service provider (such as the service provider 206) of the particular location.

In some embodiments, the gateway device 306 can support A-GPS (assisted-GPS) or A-GNSS (assisted-GNSS). For example, this can include terrestrial (cellular) tower augmentation of a satellite signal, using the assisted-GPS (A-GPS) system, which can significantly increase weak-signal performance. In some embodiments, this implementation can be ideal for building penetration, and can decrease start lock time (e.g., ephemeris, almanac data, and/or position information downloaded from cell tower (e.g., from the network 210)), and can provide a rough position estimate even in the event of satellite failure.

In some embodiments, the gateway device 306 can support SBAS (satellite-based augmentation system). For example, SBAS can provide correction data to the gateway device 306, which may allow for stationary position accuracy of 2.5 meters (99% circular error probability (CEP)).

In some embodiments, using A-GPS, A-GNSS, and/or SBAS can provide precise time information and location information to the gateway device 306. In some embodiments, this can allow for data packet timestamps accurate to less than 100 ns (nanoseconds), using the GPS PPS (pulse per second) signal, which can allow for system-wide coordination with reliable time precision. Further, in some embodiments, the trilateration of end points (such as the end device 304) can be possible with two or more GPS-enabled gateway devices (such as the gateway device 306) installed within the end device range. For example, using two or more GNSS- or GPS-enable gateway devices allows the gateway device 306 to approximate a position of the end device 304.

In some embodiments, the gateway device 306 can receive power and/or communications via PoE (Power over Ethernet) and/or PoE+. In some embodiments, the PoE/PoE+ power injector can be internal or external to the gateway device 306. In some embodiments, the gateway device 306 can receive power via an external AD-DC converter (a "wall wort"), using a DC barrel power jack connector. Further, as understood in the context of this disclosure, the gateway device 306 can receive power via any standard, non-standard, and/or proprietary connections using different voltages and/or power capabilities.

In some embodiments, the Cell Antenna #1 and Cell Antenna #2 of the gateway device 306 can provide antenna diversity to maximize building penetration. For example, the antennas may be placed at angles of up to 90 degrees from each other, to maximize reception in randomly-polarized environments, such as buildings. For example, the antennae can be spaced at least twice as far as the transmission wavelength. For example, increasing antennae spacing can introduce antenna receive diversity, providing installation flexibility that allows for modification of antenna location and antenna-to-antenna spacing/relative orientation, which maximizes the benefit(s) of diversity. At sites with sufficient signal strength, the antenna may be closer than twice of a distance of a transmission wavelength. As may be understood in the context of this disclosure, the transmission wavelength can vary according to implementation. Non-limiting examples of transmission frequency (which is proportional to wavelength) are LTE FDD Bands 4 and 13. In some embodiments, the antenna spacing is on the order of 2 feet.

In some embodiments, the Cell Antenna #1 and the Cell Antenna #2 coupled with the gateway device 306 can provide a cellular connection to transmit meter readings to a service provider, provide communications for A-GPS or A-GNSS, and/or can provide software and/or firmware updates to the gateway device 306 and/or the end device 304. For example, software and/or firmware updates may determine sampling frequencies, reporting frequencies, sleep periods, etc. of the device to optimize data resolution and/or device resources, such as battery power. Further, software and/or firmware updates can be implemented for security updates or updated encryption algorithms, for example.

Example End Device and Methods

Figure 4A:
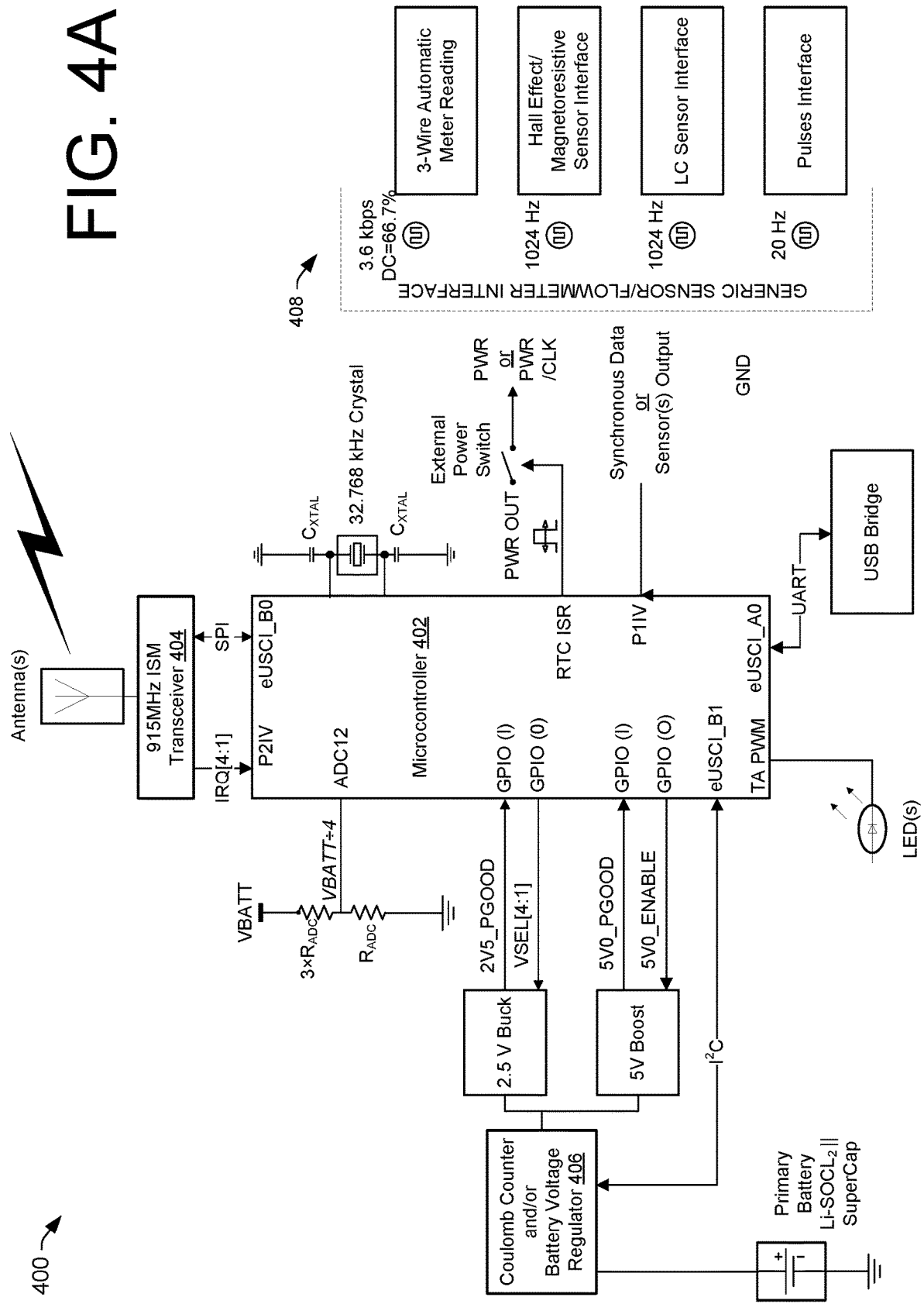
FIG. 4A illustrates a graphic representation of components of an example end device.

FIG. 4A shows a device 400 illustrating the details of an end device, such as the end device 304 of FIG. 3, for example. In some embodiments, the end device 400 includes a microcontroller 402 controlling the operations of the end device 400. For example, the microcontroller 402 can include hardware, software, or firmware to perform or support the following functions, including but not limited to: a Real-Time Clock (RTC); 16-bit timer sensor/flowmeter timing; dynamic control of RF transceiver; ADC12 for battery voltage; watchdog timer (WDTG); supply voltage supervisor (SVS); internal flash used for non-volatile memory; extended scan IF (ESIF) allowing for ultralow power magnetic sensor interface; port interrupts (PxIV) used for edge-triggering of external sensors on port 3 (P3IV), edge-triggering of power supplies on Port 1 (P1IV), external power detect on Port 3 (P3IV), and for interrupt request (IRQ) signals from transceiver on port 4 (P4IV); and/or a humidity and temperature sensor.

In some embodiments, communication between the gateway device (e.g., gateway device 306) and end devices (e.g., end device 304, 400) can be facilitated over a network such as a radio mesh network in compliance with LoRa modulation techniques, or other modulation techniques. In some embodiments, the end device 400 can include a transceiver 404, such as a SEMTECH transceiver. In some embodiments, the transceiver 404 can have the following capabilities: up to −136 dBm sensitivity; 70 dB CW interferer rejection at 1 MHz offset; able to operate with negative SNR (signal-to-noise ratio), CCR (co-channel rejection) up to 19.5 dB; emulate 49×LoRa demodulators and 1×(G)FSK demodulator; dual digital TX (transmit) and RX (receive) radio front-end interfaces; programmable demodulation paths; dynamic data-rate (DDR) adaptation; and antenna diversity or simultaneous dual-band operation.

In some embodiments, the transceiver 404 includes a RF amplifier that can increase a transmission power to 1 W, which can be enabled and/or disabled by the microcontroller 402. In some embodiments, the transceiver 404 can include a SAW (surface acoustic wave) band pass filter that can limit a bandwidth of the receiver, which in some embodiments can improve thermal (kTB) noise and can prevent out-of-band interference at the transceiver 404.

In some embodiments, the end device 400 includes a coulomb counter and/or battery voltage regulator 406 for regulating input power from a battery. In some embodiments, the battery is a lithium battery, such as a Li—SOCl$_2$ battery. In some embodiments, the battery can be coupled with a supercapacitor to provide a constant output voltage and/or to provide power during transient current spikes, which extends the life of the battery. In some embodiments, the regulator 406 includes an I²C interface to function as a coulomb counter and/or to provide current control. In some embodiments, the regulator 406 can track the total coulomb drawn from the battery throughout the operation of the end device 400. In some embodiments, this information can be transmitted to the gateway device 306 to use in monitoring a health of the end device 400, such as the state of the battery. In some embodiments, the gateway device 306 can determine an expected lifetime of the battery of the end device 400 and/or can adjust an operation of the end device 400 to optimize an operating lifetime of the end device 400.

In some embodiments, the end device 400 includes an indicator, such as a LED (light emitting diode) to generate an intermittent signal to indicate the device is functioning properly. In some embodiments, the LED can be activated periodically (e.g., every 10 seconds), while in some embodiments, the LED can be activated by a user to check the status of the end device 400. In some embodiments, the indicator can include a low-power LCD (liquid crystal display) and/or a buzzer, beeper, or speaker to provide audio feedback.

In some embodiments, the end device 400 can include a counter/totalizer to receive inputs from one or more sensors and/or flowmeters via the interface 408. For example, the microcontroller 402 can count meter output pulses from a pulse-output style meter. In some embodiments, pulse-output style meters can include a reed switch (e.g., for dry contact) and/or an open collector (e.g., for wet contact).

In some embodiments, the sensor interfaces 408 can be coupled to an interrupt at the microcontroller 402 which can increment the totalizer. In some embodiments, the totalizers can be implemented as hardware, software, or firmware in the microcontroller 402. In some embodiments, the totalizer can be resettable from the gateway device 306. In some embodiments, a time of the last observed pulse (or all observed pulses) can be kept in memory at the microcontroller 402, and can be transmitted to the gateway device 306 with the meter count. In some embodiments, the interface 408 includes edge-triggered port interrupts.

In some embodiments, the microcontroller 402 includes an ASCII reader configured in accordance with a SENSUS protocol. In some embodiments, this can provide another implementation for a sensor to communicate with the end device 400. In some embodiments, communications can occur via a 3-wire interface in accordance with the SENSUS protocol. In some embodiments, sensor data is read from the SENSUS register (ASCII characters) via the interface 408. The time of each last read can be kept in memory and communicated back to the gateway device 306 with the meter count.

In some embodiments, the microcontroller 402 includes a send data function that can automatically send data at intervals, where the data interval time can be programmable by the gateway device 306 or the service provider 206. In one example, a reporting interval can be on the order of every second, one or more minutes, hourly, daily, weekly, monthly, etc. In some embodiments, the end device 400 can transmit information when queried by the gateway device 306. Thus, the end device 400 can operate both in a push mode or a pull mode to transmit data to the gateway device 306.

In some embodiments, the microcontroller 402 can include dynamic control of the RF transceiver, such as the transceiver 404. In some embodiments, this allows the microcontroller 402 to optimize the radio link function to determine the operating configuration of the transceiver 404 by analyzing the link between the end device 400 and the gateway device 306. In some embodiments, optimization will balance radio operation with battery life. For example, at least two general modes of radio link optimization can be selectable. In some embodiments, these radio link modes can be selected by the gateway device 306 and/or by the service provider 206, for example.

By way of example, a first mode may be provided to conserve the battery of the end device 400. For example, the LoRa PHY link RF transmit power, bandwidth (BW), and spreading factor (SF) can be dynamically controlled in software to minimize power consumption and maximize range capability without the need to change hardware configuration. In some embodiments, this dynamic control can be based on a received-signal-strength indicator (RSSI), signal-to-noise ratio (SNR), packet error rate (PER), and/or channel activity detection (CAD). For example, the gateway device 306 can indicate to the end device 400 the lowest power required to provide a signal to the gateway device 306.

In some embodiments, a second mode can be provided that configures the radio in the end device 400 for the strongest radio link at the expense of using more battery power.

In some embodiments, additional modes can be provided utilizing various modulation techniques for optimized data transmission and/or power conservation. For example, the end device 400 and/or the gateway device 306 may select a communication protocol based on a number of devices, available wireless resources, signal strength, commonality of software and/or hardware, etc.

In some embodiments, the gateway device 306 can monitor the health of the end device. By monitoring specific parameters of the end device 400 (such as battery power, internal supply voltages, memory status, memory utilization, temperature, humidity, reporting frequency, data sampling rate, signal strength, location, etc.) the health of end device 400 can be monitored and reported back to the gateway device 306, and then on to the service provider 206, for example. In some embodiments, end device 400 health can be reported back to the gateway device 306 only when there is a change in one or more parameters (or a change is above or below a threshold) in order to minimize data transfer, which in turn can extend battery life.

In some embodiments, the end device 400 can include a real-time clock (RTC) in order to time stamp sensor data and to initiate time-driven events such as sleep periods, transmit events, and to coordinate receive slots. In some embodiments, the real-time clock can be implemented in hardware, software, and/or firmware to keep track of time.

In some embodiments, the end device 400 can include a voltage divider, a buck converter, and/or a boost converter to provide various voltage levels to the components of the end device 400.

In some embodiments, when implementing a 3-wire automatic meter reading, in accordance with the SENSUS protocol, the sensor interface 408 can include a shared power and clock line. In some embodiments, the clock line and power lines can be provided separately.

In some embodiments, the interface 408 and/or a USB bridge can be provided for diagnostics and/or firmware or software updated to the end device 400. In some embodiments, the interface 408 and/or a USB bridge can be the primary method for transferring sensor data from and control data to the end device 400.

Figure 4B:
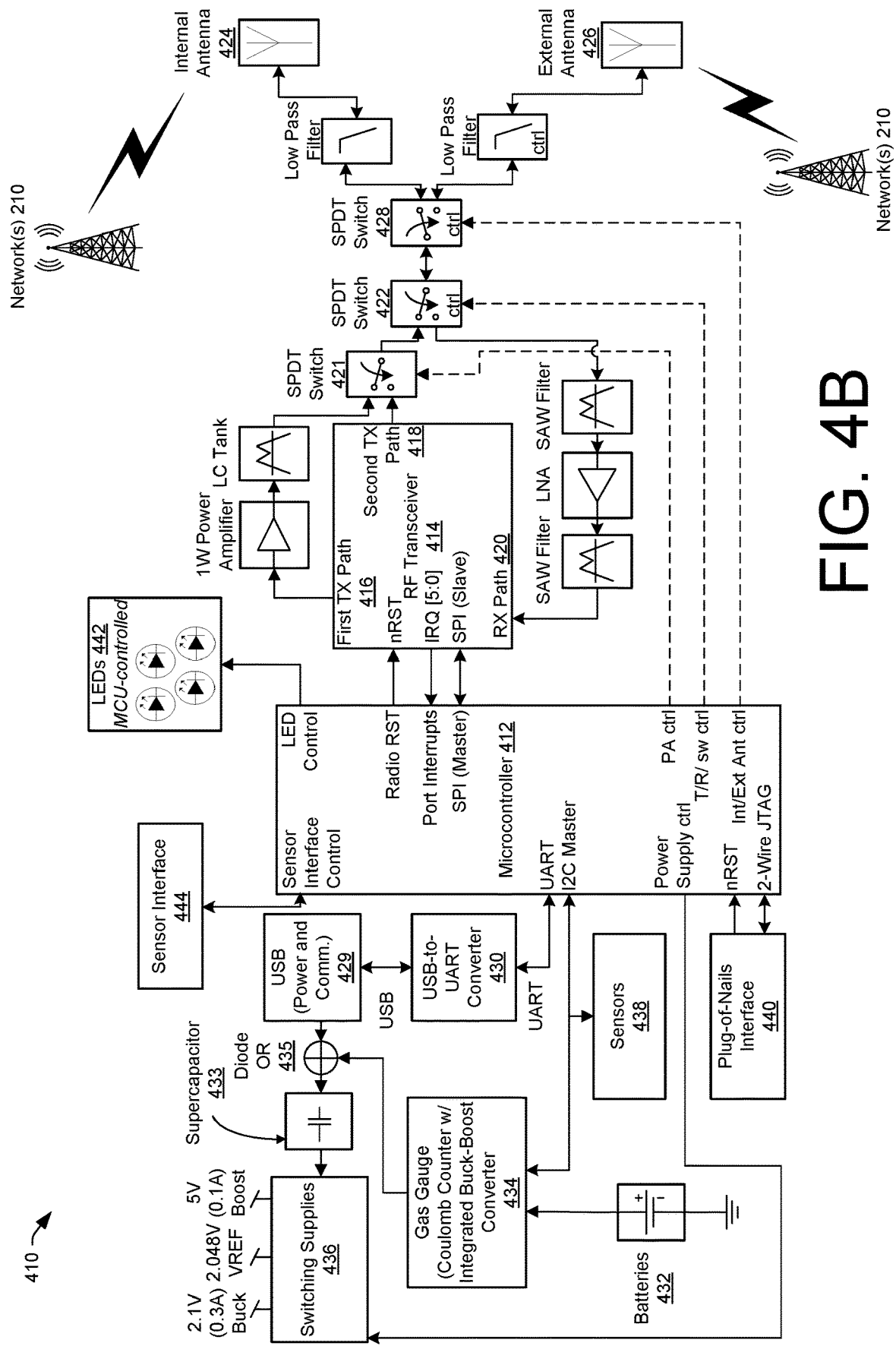
FIG. 4B illustrates a graphic representation of another example end device

FIG. 4B illustrates a graphic representation of components of an example end device 410, such as end device(s) 104, 106, 204, and/or 304. In some examples, the components of the end device 410 may be placed on one or more printed circuit boards (PCBs), disposed on an interior of a housing of the end device 410, or disposed exterior to the housing of the end device 410.

In some examples, the end device 410 includes a microcontroller 412 for controlling the operations of the end device 410. The microcontroller 412 may include various hardware, software, or firmware to perform or support the functions of the end device 410, including but not limited to: a 16-bit RISC processor with a 32-bit Hardware Multiplier operating at an 8 MHz frequency; 128 kilobytes (KB) of ferroelectric RAM (FRAM); 2 KB of SRAM; a general-purpose input/output (GPIO) pin; an encryption/decryption coprocessor (e.g., crypto-accelerator) for various encryption standards, including 128- and 256-AES (Advanced Encryption Standard); timers including five 16-bit timers and 14 total capture/compare timers; one USB communication through an external port; 1 serial peripheral interface (SPI) bus; an I$^2$C serial computer bus; a Real-Time Clock (RTC); and/or a Real-Time Clock reference at 32.768 kHz XTAL.

In some embodiments, communication between the gateway device (e.g., gateway device 306) and end devices (e.g., end device 304, 410) can be facilitated over a network such as a radio mesh or star network in compliance with LoRa modulation techniques, or other low power wide area network modulation techniques. In some embodiments, the end device 410 can include an RF transceiver 414, such as a SEMTECH transceiver. In some embodiments, the RF transceiver 414 can have the following capabilities: up to −137 dBm sensitivity; software-configurable LoRa modulator/demodulator and (G)FSK modulator/demodulator; dual TX (transmit) and RX (receive) radio front-end interfaces; programmable demodulation paths; dynamic data-rate (DDR) adaptation; and antenna diversity or simultaneous dual-band operation.

In some examples, the RF transceiver 414 may communicate with devices, such as gateway device(s) 102, 202, and/or 306. In some embodiments, the transceiver 414 may have various communication paths, such as a first transmit (TX) path 416, a second transmit path 418, and a receive (RX) path 420. In some examples, the RF transceiver 414 may employ the first TX path 416 to transmit data when the end device 410 is connected to external power. As illustrated, the first TX path 416 may include a 1 W power amplifier that can dynamically adjust transmission power to 1 W, which can be enabled and/or disabled by the microcontroller 412. In some examples, the transceiver may employ the second TX path 418 to transmit data when the end device 410 is powered by internal power. In some examples, the RF transceiver 414 may employ the RX path 420 to receive data using antennas. In some examples, the microcontroller 412 may control a single-pole double-throw switch 421 to select between the first TX path 416 and the second TX path 418 based on whether the end device 410 is connected to external power or internal power. In some examples, the microcontroller 412 may control a single-pole double-throw switch 422 to select between one of the TX paths 416 and 418, or the RX path 420, based on whether the RF transceiver 414 is transmitting or receiving data. In various embodiments, the first TX path 416, second TX path 418, and/or the RX path 420 may include one or more SAW (surface acoustic wave) band pass filters or low pass filters that can limit a bandwidth of the receiver, which in some embodiments can improve thermal (kTB) noise and can prevent out-of-band interference and attenuate the transmission of harmonics at the transceiver 414.

In various examples, the end device 410 may include an internal antenna 424 located inside of a housing of the end device 410 to transmit and receive signals for the RF transceiver 414 over networks 210. In some examples, the end device 410 may further include an external antenna 426 located exterior to the housing of the end device to transmit and receive signals for the RF transceiver over networks 210. In some examples, the end device 410 may include one or more ports adapted to couple the end device 410 with one or more external antennas. The microcontroller may control whether the RF transceiver 414 uses the internal antenna 424 or the external antenna 426 using a single-pole double-throw switch 428. For instance, if the end device 410 is in an environment where RF signals have trouble reaching (e.g., metal box, basement of a building, etc.), if a received signal strength is below a threshold, or if a transmission has not been received or acknowledged, the microcontroller 412 may be programmed to select the external antenna 426, which may be positioned outside of the environment.

In various embodiments, the end device 410 may be powered through an external power supply, such as USB (universal serial bus) power 429, which may provide power at various voltages, such as 5 volts. In other examples, wall connection may power the end device 410. In some examples, the end device 410 may include a USB-to-UART converter 430 which receives power through the USB power 429. In some examples, the USB 429 further comprises a USB bridge that can be used for various communications, such as diagnostics and/or firmware or software updates to the end device 410.

In some examples, the end device 410 includes one or more batteries 432 and one or more supercapacitors 433 which serve as an internal power supply. In some examples, the batteries 432 and supercapacitors 433 may power components of the end device 410 (e.g., microcontroller 412, RF transceiver 414, etc.). In some examples, the end device 410 may include a gas gauge 434. The gas gauge 434 may include a coulomb counter with an integrated buck-boost converter. In some examples, the gas gauge 434 may limit current that flows from the batteries 432 to charge the supercapacitor 433. Further description of the batteries 432 and the supercapacitor 433 can be found in the description for FIG. 6B.

In some examples, the end device 410 may include a diode 435, such as an OR diode, that may be controllable by the microcontroller 412, or may automatically select between external power (e.g., the USB power 429) or internal power (e.g., the batteries 432 and the supercapacitor 433). In some instances, the end device 410 includes various switching supplies 436, such as a 2.1V buck converter, a 2.048 V VREF, and/or a 5V boost converter. In some examples, the switching supplies 436 may step up, or step down, the voltage of the power supplied the external power supply or the internal power supply based on the voltage ratings for powering components in the end device 410.

In some examples, the end device 410 may include one or more sensors 438 for measuring conditions inside of the end device 410 and/or in the environment of the end device 410. In some examples, the sensors 438 may include a relative humidity sensor, a pressure sensor, and/or a temperature sensor. The microcontroller 412 may control the sensors 438 and/or receive measurements from the sensors.

In some instances, the end device 410 may include a plug-of-nails interface 440 to receive a plug-of-nails connector. In some instances, the plug-of-nails interface 440 may receive a connection of a plug-of-nails cable to program the microcontroller 412 and/or processors included in the microcontroller 412. In some instances, the plug-of-nails interface 440 may comprise a contact with one or more through-holes and connection points for a plug-of-nails connector to enter and contact. In this way, the plug-of-nails interface 440 may save space on the circuit board, lower bill of material (BOM) cost, and lower inventory load of the end device 410 because no mechanical piece of equipment is populated on the board.

In some examples, the end device 410 may include one or more light emitting diodes (LEDs) 442. The LEDs 442 may include four MCU LEDs that are not externally visible, one power LED (e.g., such as an LED 1219, described below in connection with FIG. 12) that is on when external power is supplied, and two LEDs (one LED for USB transmit and one LED for USB receive) that are not externally visible for the end device 410 when inside an enclosure 1100, described below in connection with FIG. 11.

In some examples, the microcontroller 412 includes a sensor interface 444 for communicating with various sensors, such as sensors 114, 116, and/or 302. In some examples, the sensor interface 444 may include one or more hardware ports configured to communicatively couple the end device 410 with the sensors, such as through one or more cables. In some instances, the sensor interface further includes one or more components, modules, and/or circuits to receive data and store the data from the sensors. In some examples, the sensor interface 444 is configured to couple with multiple sensors, including but not limited to 3-wire Automatic Meter Reading (AMR) sensors, Hall effect sensors, reed switch sensors, pulses sensors, and magneto-resistive sensors. In some instances, the sensor interface 444 may include any wired or wireless interface. Further description of the sensor interface 444 can be found in the description of FIG. 6B.

In some embodiments, the sensor interface 444 can be coupled to an interrupt at the microcontroller 412 which can increment the totalizer. In some embodiments, the totalizers can be implemented as hardware, software, or firmware in the microcontroller 412. In some embodiments, the totalizer can be resettable from the gateway device 306. In some embodiments, a time of the last observed pulse (or all observed pulses) can be kept in memory at the microcontroller 412, and can be transmitted to the gateway device 306 with the meter count. In some embodiments, the interface 444 includes edge-triggered port interrupts.

In some embodiments, the microcontroller 412 includes an ASCII reader configured in accordance with a SENSUS protocol. In some embodiments, this can provide another implementation for a sensor to communicate with the end device 410. In some embodiments, communications can occur via a 3-wire interface in accordance with the SENSUS protocol. In some embodiments, sensor data is read from the SENSUS register (e.g., as ASCII characters) via the sensor interface 444. The time of each last read can be kept in memory and communicated back to the gateway device 306 with the meter count.

In some embodiments, the microcontroller 412 includes a send data function that can automatically send data at intervals, where the data interval time can be programmable by the gateway device 306 or the service provider 206. In one example, a reporting interval can be on the order of every second, one or more minutes, hourly, daily, weekly, monthly, etc. In some embodiments, the end device 410 can transmit information when queried by the gateway device 306. Thus, the end device 410 can operate both in a push mode or a pull mode to transmit data to the gateway device 306.

In some embodiments, the microcontroller 412 can include dynamic control of the RF transceiver. In some embodiments, this allows the microcontroller 412 to optimize the radio link function to determine the operating configuration of the transceiver 414 by analyzing the link between the end device 410 and the gateway device 306. In some embodiments, optimization will balance radio operation with battery life. For example, at least two general modes of radio link optimization can be selectable. In some embodiments, these radio link modes can be selected by the gateway device 306 and/or by the service provider 206, for example.

By way of example, a first mode may be provided to conserve the batteries of the end device 410. For example, the LoRa (or any low power wireless area network protocol) PHY link RF transmit power, bandwidth (BW), and spreading factor (SF) can be dynamically controlled in software to minimize power consumption and maximize range capability without the need to change hardware configuration. In some embodiments, this dynamic control can be based on a received-signal-strength indicator (RSSI), signal-to-noise ratio (SNR), packet error rate (PER), and channel activity detection (CAD). For example, the gateway device 306 can indicate to the end device 410 the lowest power required to provide a signal to the gateway device 306.

In some embodiments, a second mode can be provided that configures the radio in the end device 410 for the strongest radio link (e.g., 1 watt) at the expense of using more battery power.

In some embodiments, the end device 410 can monitor the health of the end device 410. By monitoring specific parameters of the end device 410 (such as battery power, supply voltage, memory status, memory utilization, temperature, humidity, reporting frequency, data sampling rate, signal strength, location, etc.) the health of end device 410 can be monitored and reported back to the gateway device 306, and then on to the service provider 206, for example. In some embodiments, end device health can be reported back to the gateway device only when there is a change in one or more parameters (or a change is above or below a threshold) in order to minimize data transfer, which in turn can extend battery life.

In some embodiments, the end device 410 can include a real-time clock (RTC) in order to time stamp sensor data and to initiate time-driven events such as sleep periods, transmit events, and to coordinate receive slots. In some embodiments, the real-time clock can be implemented in hardware, software, and/or firmware to keep track of time.

Figure 5:
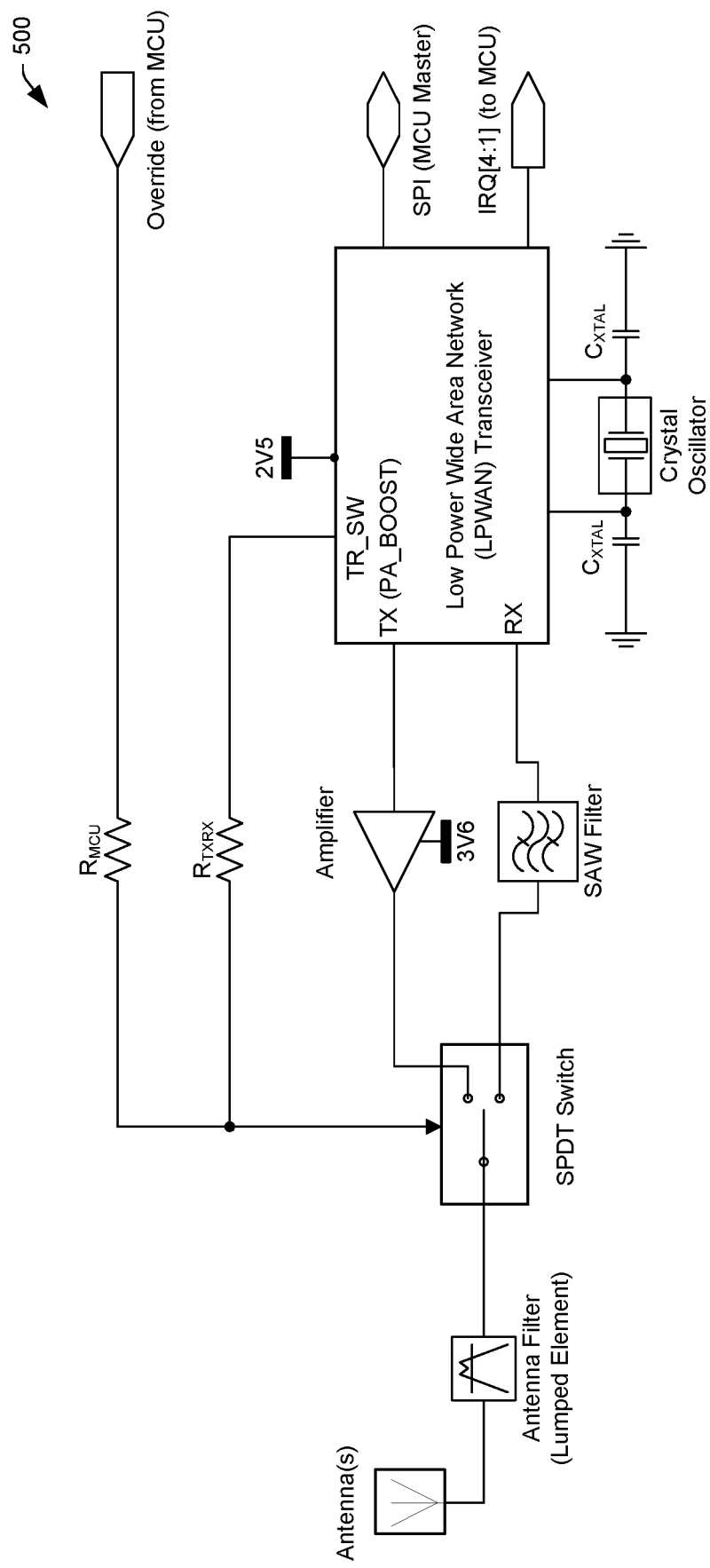
FIG. 5 illustrates example components of a transceiver of an end device.

FIG. 5 shows a device 500 illustrating details of a transceiver, such as the transceiver 404 of FIG. 4A and the RF transceiver 414 of FIG. 4B, for example. In some embodiments, the transceiver 500 is a LoRa transceiver, such as a SEMTECH transceiver. In some embodiments, the transceiver 500 may implement any wireless communication protocol in accordance with the SEMTECH transceiver.

In some embodiments, the transceiver 500 can include transmit/receive (TR) control of a SPDT (single pole, double throw) switch. In some embodiments, independent receive and transmit paths can allow for impedance matching customized for each path. For example, impedance matching can provide approximately a 2 dB gain in the link budget. In some embodiments, two or more antennae can be used in addition to or instead of the SPDT switch.

In some embodiments, the SEMTECH module has two pins available for transmit: RFO_HF (22), which has a transmission power of −4 dBm to +14 dBm; and PA BOOST: −2 dBm to +20 dBm. In some embodiments, the former pin provides high efficiency, while the latter pin can be less efficient, but can provide better transmission range.

In some embodiments, the transmission pin can be selected dynamically in accordance with one or more instructions received from the gateway device 306, for example.

Figure 6:
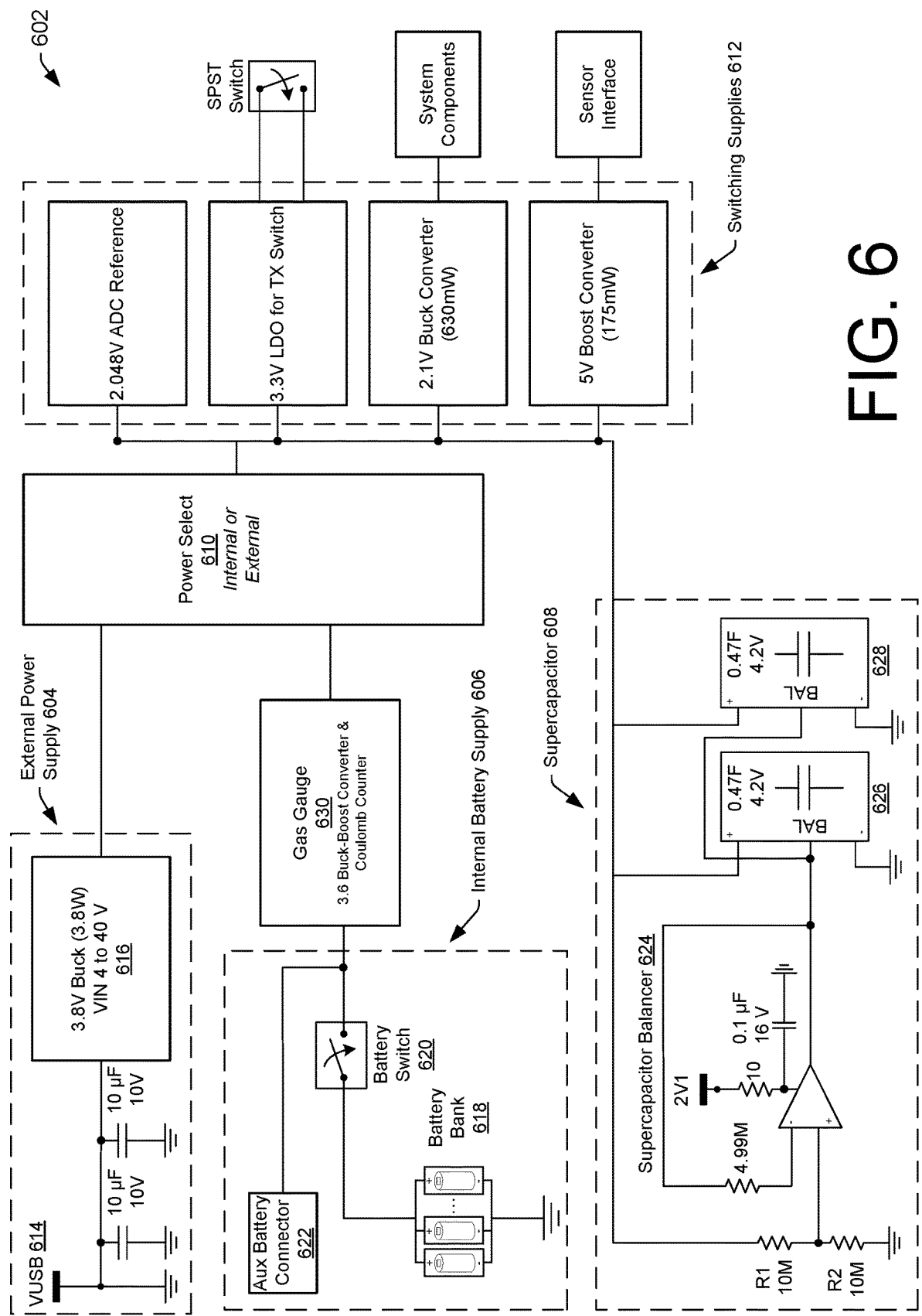
FIG. 6 illustrates an example power supply that can be implemented in an end device.

FIG. 6 illustrates an embodiment of a power supply 602 which can be implemented in the end device 400 of FIG. 4A and/or the end device 410 of FIG. 4B.

In some examples, the power supply 602 may include an external power supply 604 and an internal power supply including internal battery supply 606 and supercapacitor 608. In various examples, the power supply 602 may include a power select 610 to select between the external power supply 604 and the internal power supply including the internal battery supply 606, with selected power output to supercapacitor 608. In various examples, one or more of the external power supply 604 or the internal power supply including the internal battery supply 606 and the supercapacitor 608 may provide power to one or more switching supplies 612, which in turn provide power to various components of the end device 400 and/or end device 410.

In some examples, the external power supply 604 may comprise power supplied through a USB port of the end device 410 (e.g., USB 429). In some examples, the supply voltage VUSB 614 may comprise a voltage supplied through a USB port ranging from 4.0 volts to 5.25 volts. The external power supply 604 may further include a 3.8-volt buck converter 616 configured to receive a voltage between 4 volts to 40 volts and step the voltage down to 3.8 volts to supply power to the end device 410. While illustrated as being a USB power source, the external power supply 604 may additionally or alternatively comprise any type of external power supply, such as wall power.

The power supply 602 may further include an internal power supply comprising the internal battery supply 606 and supercapacitor 608. In some examples, the internal battery supply 606 may include a battery bank 618, a battery switch 620, and an auxiliary battery connector 622. In some instances, the battery bank 618 may include one or more batteries arranged in series or parallel to provide power to the end device 410. In some instances, the battery bank 618 may include any type of battery, such as lithium thionyl chloride (Li—SOCl$_2$), and comprise any number or size of batteries. The battery switch 620 may be any type of switch (e.g., single-pole single-throw) controlled by a microcontroller, such as microcontrollers 402 and/or 412, configured to selectively allow the battery bank 618 to provide power to the components and circuitry of the end device 410. For example, the battery switch 620 may be a physical toggle switch operable to isolate the internal battery supply 606 from the power supply 602 to prevent the battery bank 618 from draining during transport. The auxiliary battery connector 622 may comprise any type of hardware connector with electrical connections to connect to the battery bank 618 and provide electrical paths from the battery bank 618 to the circuitry of the power supply 602. In some examples, the internal battery supply 606 may charge the supercapacitor 608.

The supercapacitor 608 may comprise a supercapacitor balancer circuit 624, a first capacitor 626, and a second capacitor 628. In some instances, the first capacitor 626 comprises a single capacitor, or two or more capacitors in series. In some instances, a number of capacitors may be selected based on an amount of energy to store, voltage requirements, transmission power, etc. In some instances, the second capacitor 628 may comprise any number of capacitors, similar to the first capacitor 626. In some examples, the supercapacitor balancer circuit 624 may include various components, including resistors, capacitors, and operational amplifiers. However, other types of supercapacitor balancing circuits may be implemented as the supercapacitor balancer circuit 624. In some examples, the supercapacitor balancer circuit 624 may operate to prevent an over-voltage problem and/or an over-current problem occurring with the capacitors 626 and 628. For example, the supercapacitor balancer circuit 624 may prevent the capacitors 626 and 628 from damage caused by too much voltage or current supplied from the internal battery supply 606. In various examples, components of the supercapacitor balancer circuit 624 may include one or more 10 mega ohm resistors, as illustrated. The selection of these relatively high value resistors may result in benefits, such as less current loss. For example, the supercapacitor balancer circuit 624 may have an input voltage of 3.6 volts up to 4.2 volts. While simple passive resistors may work in place of the active supercapacitor balancer circuit 624, resistors around the range of 1 mega ohm may result in wasted current due to losses, such as 4 micro amps of wasted current. In some examples, this may be a significant amount of loss (e.g., 15% of total consumption). Accordingly, the selection of the 10 mega ohm, or another similarly high resistance, may result in less wasted current, which may lengthen the life of the battery bank 618.

In some examples, the first capacitor 626 and the second capacitor 628 may be placed in parallel and receive power through the supercapacitor balancer circuit 624. In some examples, the first capacitor 626 and the second capacitor 628 may comprise roughly 0.5 farad capacitors (e.g., 0.47 F) that, when placed in parallel, result in a 1 farad capacitance. The supercapacitor balancer circuit 624 may charge the first capacitor 626 and the second capacitor 628 using power supplied from the internal battery supply 606.

In some examples, the power supply 602 may include a gas gauge 630, such as gas gauge 434 of FIG. 4B. In some examples, the gas gauge 630 may include a 3.6-volt buck-boost converter to adjust the voltage from the battery bank 618 to be approximately 3.6 volts. In some examples, the gas gauge 630 may further include a coulomb counter. The coulomb counter may count the coulombs (e.g., amp-seconds) leaving the battery bank 618 to charge the supercapacitor 608 during the low power mode to determine total energy out of battery bank 618 and/or how much energy remains in the battery bank 618. In some examples, the gas gauge 630 may limit the amount of current leaving the battery bank 618 from surpassing a threshold current to prevent the battery bank 618 from discharging too quickly when charging the supercapacitor 608. In some examples, this may extend the life of the battery bank 618.

In some examples, the power select 610 may select between the external power supply 604 and the internal battery supply 606. In some examples, the power select 610 may comprise one or more switches, transistors, or other components controlled by a microcontroller (e.g., microcontroller 412) to select between the external power supply 604 and the internal battery supply 606. In some examples, the power select 610 may select the external power supply 604 to function as the source for power supply 602 when the end device 410 is connected to external power, and otherwise select the internal battery supply 606.

In some examples, the switching supplies 612 may receive power, either from the external power supply 604, or the internal power supply including the internal battery supply 606 and the supercapacitor 608. The switching supplies 612 may regulate the voltage received from the power sources (internal or external) and switch the voltage to appropriate voltages for various components of the end device 410. The switching supplies 612 may include a 2.048 volt ADC reference, a 3.3 volt LDO voltage regulator for a single pole double throw switch for transmission, such as single-pole double-throw switch 421, a 2.1 volt buck converter for various system components (e.g., microcontroller 412, RF transceiver 414, diodes, op-amps, etc.), and a 5 volt boost converter for a sensor interface (e.g., sensor interface 444).

In examples where the internal battery supply 606 is selected by the power select 610 to serve as the power supply 602, the supercapacitor 608 may be discharged, and then recharged by the internal battery supply 606. In some examples, the supercapacitor 608 may be charged and discharged according to a duty cycle, where the duty cycle is controlled by one or more of the microcontroller 412 and/or RF transceiver 414.

In some examples, the end device 410 may only transmit resource measurement data collected by sensors at various intervals. When the end device 410 is not transmitting data, the RF transceiver 414 and associated circuitry may be powered down in a low power mode. In this way, when the end device 410 is not transmitting, power may be saved to extend the life of the battery bank 618. In some examples, the duty cycle may have a longer time period for the lower power mode when data is being stored (e.g., 30 seconds, 1 minute, 5 minutes, etc.), than a communication mode when data is being transmitted (e.g., 10 milliseconds, 100 milliseconds, etc.). In some examples, the microcontroller 412 may employ the RF transceiver 414 to transmit relatively high power signals (e.g., ½-watt, 1-watt, etc.). In such examples, the power provided by the internal battery supply 606 may be insufficient, and the supercapacitor 608 may be used to power the circuitry of the RF transceiver 414. For example, the supercapacitor 608 may provide the 1 W power amplifier and the RF transceiver 414 with up to 1.5 W of power, enabling the RF transceiver 414 to transmit the high power signals. In some examples, the supercapacitor 608 may at least partially discharge when providing power to the RF transceiver 414 in the communication mode. Once the supercapacitor 608 has finished supplying power to the RF transceiver 414 to transmit a signal, the battery bank 618 may recharge the supercapacitor 608 during the low power mode for the longer periods of time to charge the supercapacitor 608 for the next transmission. In this way, the end device 410 may receive and store resource measurement data from sensors using the internal battery supply 606 while in the low power mode, and transmit resource consumption data periodically using relatively high power signals powered by the supercapacitor 608. In some examples, the communication mode and low power mode intervals may be set or based on the transmission power of the signals.

In some examples, the intervals for the communication mode and low power mode may be dynamically adjusted or determined based on the remaining charge in the battery bank 618. For example, the coulomb counter may determine that the battery bank 618 is running low, and lengthen the interval of the low power mode.

In some examples, the internal battery supply and/or supercapacitor 608 may further act as an uninterrupted power supply (UPS) for the end device 410 when an external power supply 604 is connected, but is providing interrupted power.

In various examples, the power supply 602 or a portion of the power supply 602 (e.g., internal battery supply 606, battery bank 618, supercapacitor 608, etc.) may be thermally coupled to a heat sink. For example, the end device 410 may include a heat sink which may be coupled to an external heat sink, depending on an installation. In some examples, the internal components of the end device 410 may be coupled to a heat sink, such as a pipe, that maintains a relatively stable temperature and may serve as a heat sink. Further, heat sink may be integrated into an installation bracket, which may be clamped to a pipe using one or more hose claims, thereby improving operation of the end device 410 and ease of installation.

Figure 7:
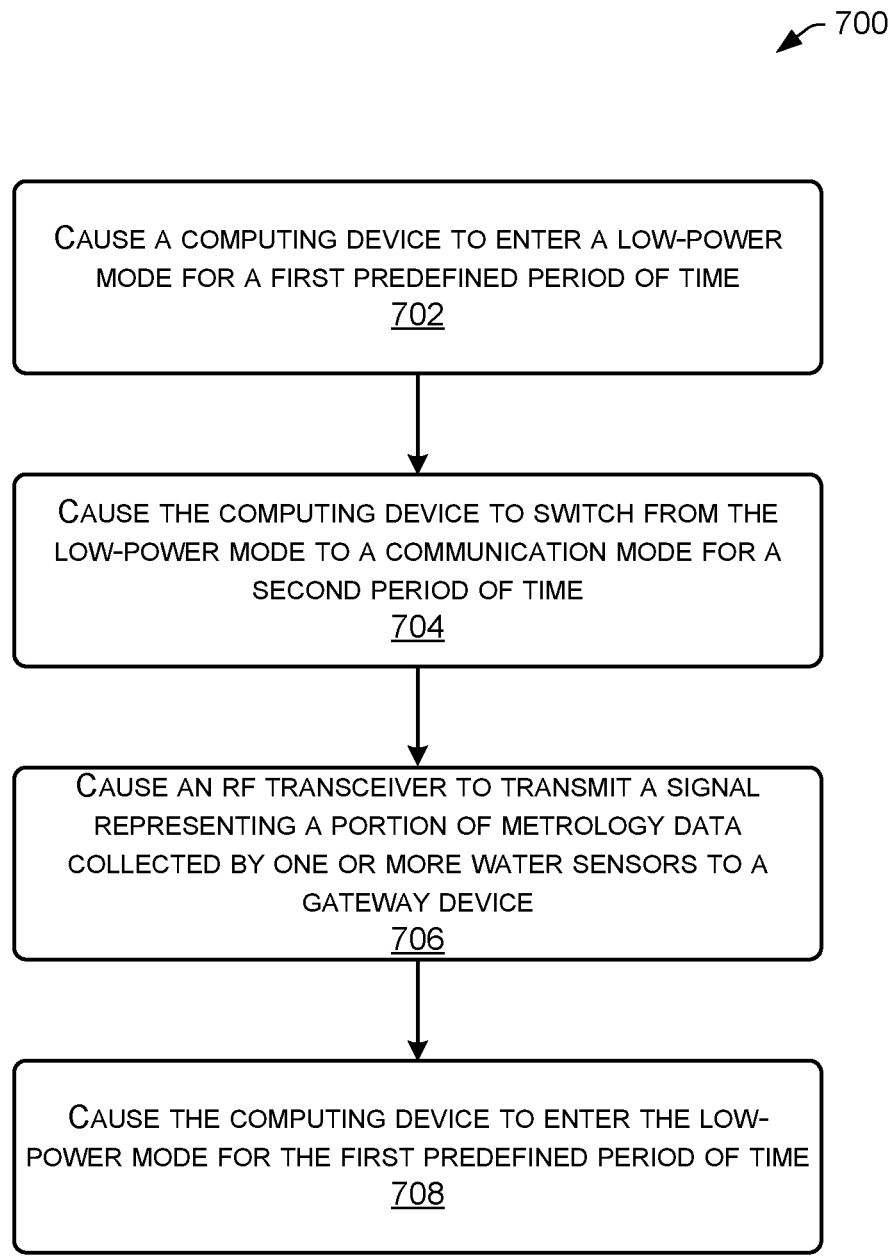
FIG. 7 illustrates an example process for transmitting a signal, by an RF transceiver of a computing device, according to a duty cycle of the computing device.

FIG. 7 illustrates an example process 700 for transmitting a signal, by a transceiver of an end device (e.g., computing device), according to a duty cycle of the end device. The operations of the process 700 may be performed by one or more of software, hardware, firmware, or a combination thereof, of the end device.

At 702, the process 700 may cause the end device (e.g., end device 400, end device 410, etc.) to enter a low-power mode for a first predefined period of time. In some examples, the end device may limit or remove power from various portions of the end device during the low-power mode (e.g., RF transceiver 414, components 420, 422, 428, etc.). In some examples, the end device may still power other portions of the device, such as portions which receive and store data from one or more sensors (e.g., microcontroller 412, sensor interface 444, etc.). For example, in a case where a 3-wire AMR sensor is coupled to the end device 410, the entire end device 410 (aside from a timer mechanism) shuts down in between meter reads (e.g., for 5 to 60 seconds). In some instances, when interfacing with a reed switch, magneto-resistive sensor, or Hall effect sensors, the micro control unit on the end device 410 may wake up frequently to sample the sensor (e.g., to wake up for 50 µs every 5 ms, or about 1% duty cycle.)

At 704, the process 700 may cause the end device to switch from the low-power mode to a communication mode for a second period of time. In some examples, the end device may switch to the communication mode based at least in part on detecting an end of the first predefined period of time. In some examples, the second period of time may be less (e.g., 10 milliseconds, 100 milliseconds, etc.) than the first predefined period of time (e.g., 30 seconds, 1 minute, 5 minutes, 15 minutes, etc.). In various examples, the end device may consume less power while in the low-power mode than the communication mode. In some examples, switching to the communication mode may comprise turning on or providing power to various components of the end device (e.g., RF transceiver 414, components 420, 422, 428, etc.).

At 706, the process 700 may cause an RF transceiver (e.g., RF transceiver 414) to transmit a signal representing a portion of metrology data collected by one or more water sensors to a gateway device. In some examples, a supercapacitor (e.g., supercapacitor 608) may power the RF transceiver and other components required to transmit the signal. In some examples, the signal may comprise a high power signal (e.g., ½-watt, 1-watt, etc.). As may be understood, although described in connection with water data, aspects of this disclosure may be applied to one or more sensors configured to monitor data associated with any resource.

At 708, the process 700 may cause the end device to enter the low-power mode for the first predefined period of time. In some examples, the computing device may enter the low-power mode in response to completing the transmitting of the signal. In some examples, the computing device may enter the low-power mode in response to detecting an end of the second period of time. In some examples, the computing device may enter the low-power mode in response to receiving an ACK from the gateway, indicating that a transmission from the end device to the gateway has been received.

Figure 8:
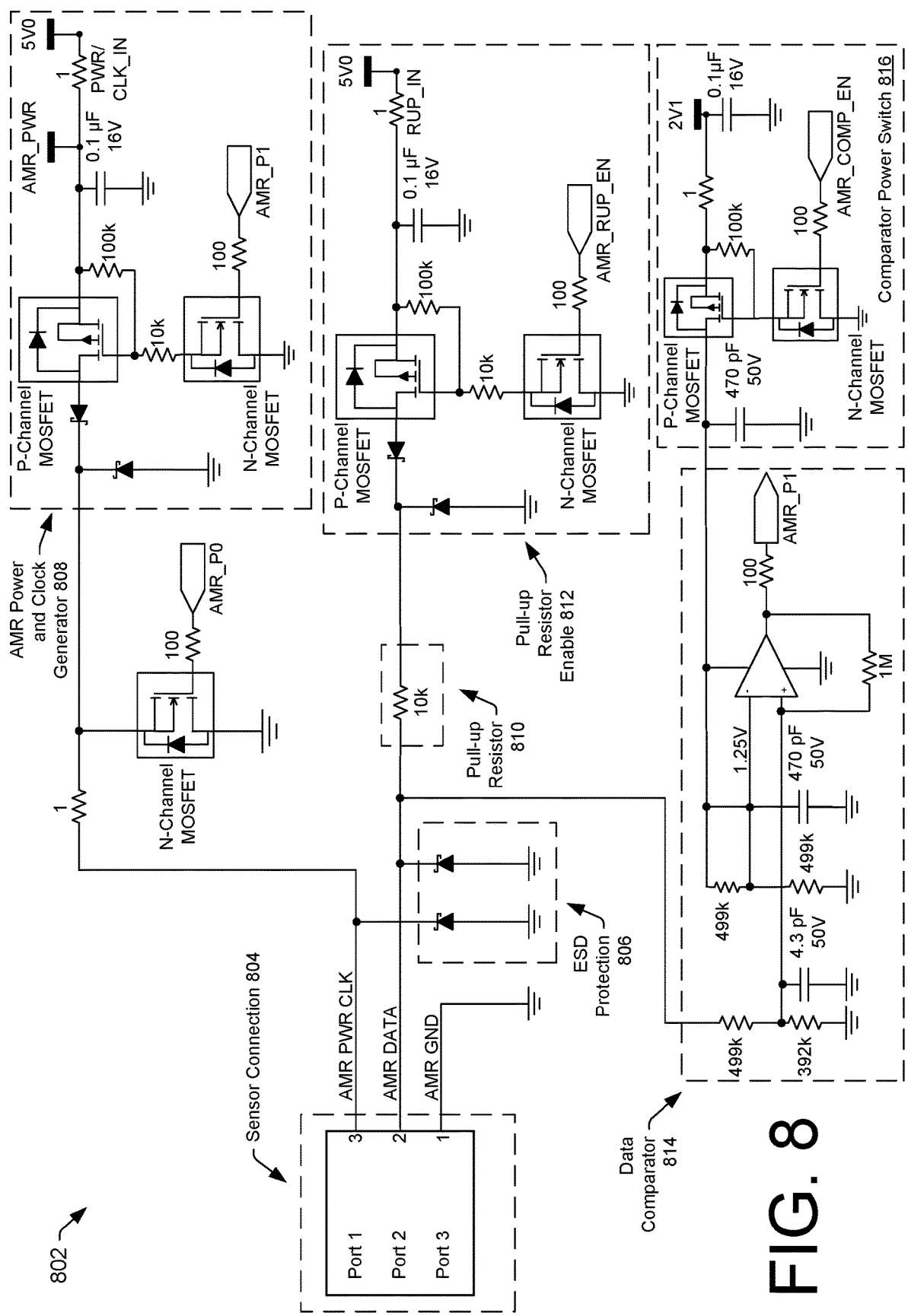
FIG. 8 illustrates an example sensor interface of an end device configured to communicate with various sensors.

Thus, the process 700 illustrates an example of a duty cycle for an end device, where the transmission that occurs in the communication mode is powered by a supercapacitor to transmit a higher power signal FIG. 8 illustrates an example sensor interface 802 (e.g., sensor interface 444) which enables an end device, such as end device 400 and/or end device 410, to communicate with various sensors, such as sensors 114, 116, and/or 302. The sensor interface 802 includes a sensor connection 804, which includes three input ports, where each input port receives a wire, cable, input jack, or any other connector. As shown, port 1 and port 2 each have electrostatic discharge (ESD) protection 806 in the form of Zener diodes connected to ground. However, in other examples, the ESD protection 806 may comprise another type of ESD or other transient voltage protection. Port 3 provides a ground input port for various sensors that are connected to the sensor connection 804.

Port 1 is electrically connected to an AMR power clock generator 808, and port 2 is electrically connected to a pull-up resistor 810 and a pull-up resistor enable 812. Port 2 further maps to a data comparator 814 and a comparator power switch 816.

In some examples, port 2 comprises a data port which receives data from the sensors connected to the sensor connection 804. Depending on the type of sensor, only port 2 need be utilized to collect data. For example, a reed switch sensor is connected, only one cable plugged into or connected to port 2, and grounded through port 3, is required to communicate data via the sensors interface 802.

In examples where a Hall effect sensor, a magneto-resistive sensor, or a reed switch sensor is connected, the pull-up resistor enable 812 may be activated to "pull up" the pull-up resistor 810 by placing a voltage at port 2 that corresponds to a voltage for communicating with a Hall effect sensor, a magneto-resistive sensor, a reed switch sensor, or any other sensor with an open drain or open collector output. For example, the microcontroller 412 may employ a P-channel MOSFET of the pull-up resistor enable 812 to turn on the pull-up resistor on or off depending on whether the sensor output is open collector/open drain or push-pull, respectively.

In examples where the microcontroller 412 turns on the P-channel MOSFET to cause the pull-up resistor enable 812 to turn on the pull-up resistor 810 to accept input from a Hall effect sensor, a magneto-resistive sensor, or a reed switch sensor via port 2 of the sensor connection 804, the data comparator 814 and comparator power switch 816 receive the data input from the sensor. In some examples, one or more modules, which may comprise software, may cause the microcontroller 412 to configure the data comparator 814 and comparator power switch 816 to count power pulses from the sensors.

In some examples, the sensor input into the sensor connection 804 may comprise one of an AMR sensor or a pulse sensor. In such examples, the AMR sensor or pulse sensor may plug into all three ports of the sensor connection 804. The AMR power and clock generator 808 circuit may provide power and timing to the AMR sensor or pulse sensor through port 1. However, in examples where the sensor comprises an AMR sensor or pulse sensor, the microcontroller 412 will only cause the pull-up resistor enable 812 to turn on the pull-up resistor 810 when the sensor output is an open collector/open drain, otherwise, pull-up resistor enable 812 turns off pull-up resistor 810 for sensors with push-pull outputs. Similar to the other types of sensors, the comparator power switch 816 may be selectively turned on and off according to software-based duty cycle by the microcontroller 412 to receive pulses from a sensor using the data comparator 814. In some examples, the data comparator 814 may store the sensor pulse data in a register of the end device 410.

Regardless of the type of sensor, software-based modules cause the microcontroller 412 to selectively activate the comparator power switch 816 (e.g., by activating the P-channel MOSFET), which in turn selectively powers the data comparator 814 to turn on and collect pulse data from the sensors, and turn back off after collecting the data according to the duty cycle. In some examples, by pulsing the data comparator 814, the duty cycle may minimize power consumption for counting power pulses from the sensors.

In some examples, the duty cycle may depend on the type of sensor. For example, various sensors may have different rotational speeds and/or different sensor outputs, and the duty cycle may be adjusted to ensure that the data comparator 814 is turned on to receive and store the data, but turned off when the sensors are not providing data via port 2 of the sensor connection 804. Further description of these techniques are found below with reference to the processes of FIGS. 9 and 10.

Figure 9:
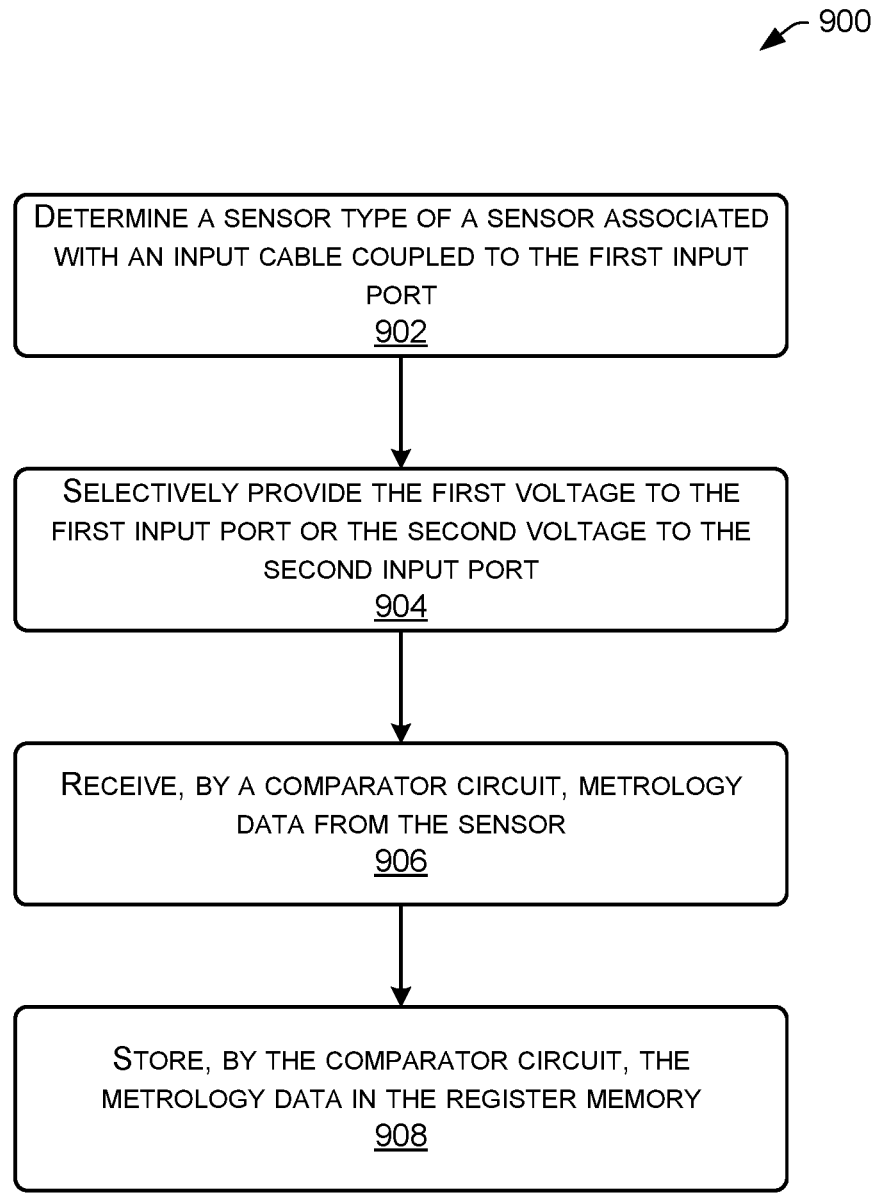
FIG. 9 illustrates an example process for determining a sensor type of a sensor associated with an input cable coupled to a first input port, and applying a voltage to an input port to receive data from the sensor based on the type of sensor

FIG. 9 illustrates an example process 900 for determining a sensor type of a sensor associated with an input cable coupled to a first input port, and applying a voltage to an input port to receive data from the sensor based on the type of sensor. In some examples, the microcontroller 412 of end device 410 may perform the techniques of process 900.

At 902, the process 900 may determine a sensor type of a sensor associated with an input cable coupled to the first input port. In some examples, the input port may correspond to port 2 of the sensor connection 804. In various examples, the sensor type is a first sensor type, and the sensor comprises at least one of a reed switch sensor, a Hall effect sensor, or a magneto-resistive sensor. In other examples, the sensor type is a second sensor type, and the sensor comprises at least one of a pulse sensor or an AMR sensor.

In some examples, determining the sensor type may comprise receiving, through a USB cable plugged into a USB port of the end device 410, an indication of the sensor type. For example, a computing device (e.g., computing device 208) may connect to the end device 410 to provide the indication of the sensor type. In some examples, determining the sensor type may comprise receiving, via the RF transceiver 414 and from one or more server computing devices (e.g., service provider(s) 206), a signal comprising the indication of the sensor type.

At 904, the process 900 may, based at least in part on determining the sensor type, selectively provide a first voltage to the first input port or a second voltage to a second input port. In some examples, the first voltage is associated with a reed switch sensor, a Hall effect sensor, or a magneto-resistive sensor, and the first port comprises port 2 of the sensor connection 804. In some examples, the second voltage is associated with a pulse sensor or an AMR sensor, and the second port comprises port 1 of the sensor connection 804.

In examples where the sensor type comprises a first sensor type associated with a reed switch sensor, a Hall effect sensor, or a magneto-resistive sensor, the microcontroller 412 may cause the pull-up resistor enable 812 to turn on the pull-up resistor 810. In examples where the sensor type comprises a second sensor type associated with one of a pulse sensor or an AMR sensor, the microcontroller 412 may cause the AMR power and clock generator 808 to turn on and place a voltage across port 1 of the sensor connection 804, which may in turn power and provide timing for the pulse sensor or the AMR sensor.

At 906, the process 900 may receive, by the comparator circuit, metrology data (e.g., resource consumption data) from the sensor. In some examples, the microcontroller 412 may cause the comparator power switch 816 to activate the data comparator 814 to receive the data according to a duty cycle.

At 908, the process 900 may store, by the comparator circuit, metrology data from the sensor. In some examples, the microcontroller 412 may cause the comparator power switch 816 to activate the data comparator 814 to store the data according to the duty cycle.

Figure 10:
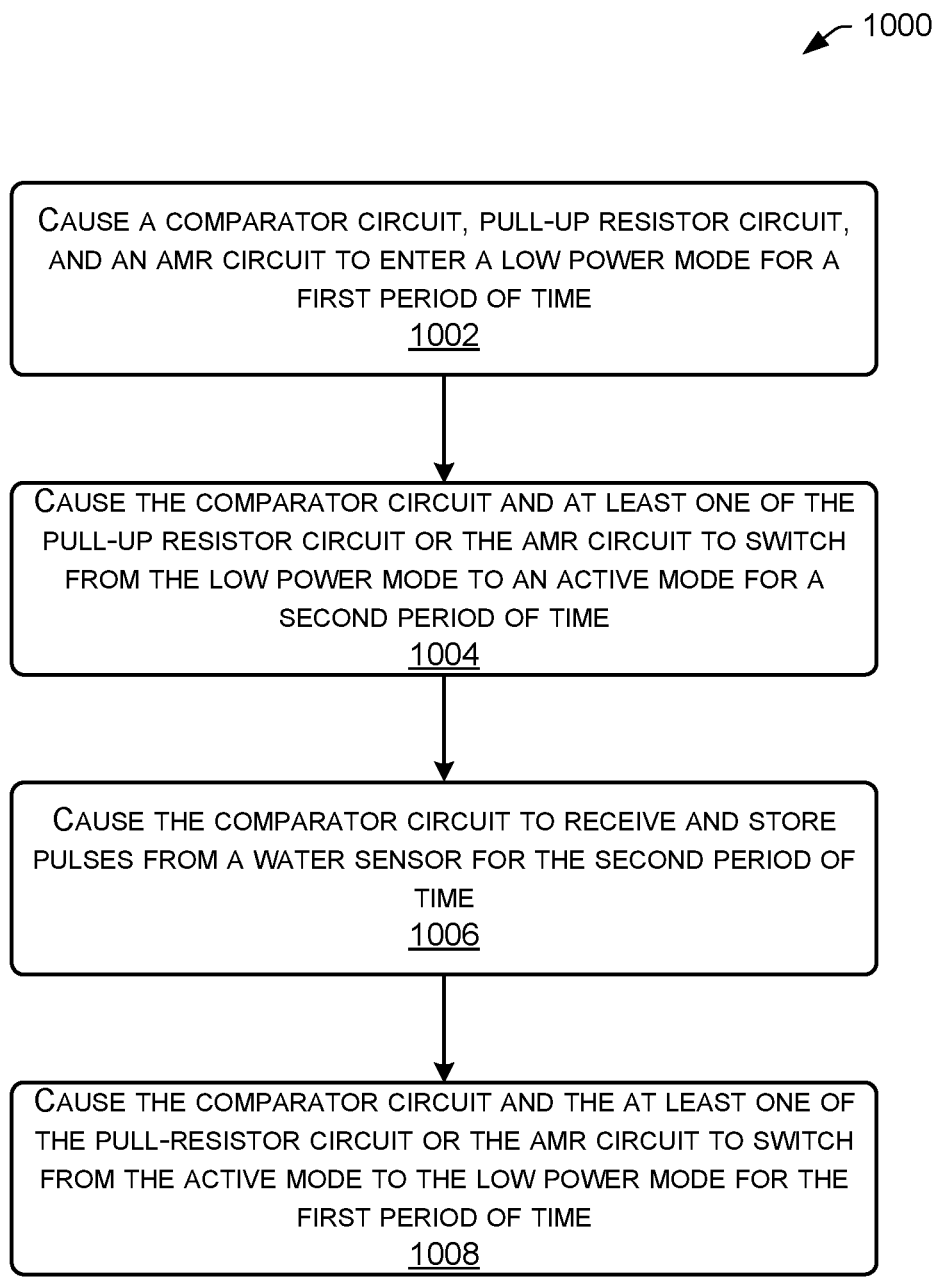
FIG. 10 illustrates an example process for receiving data and storing data by a comparator circuit according to a duty cycle.

FIG. 10 illustrates an example process 1000 for receiving data by a comparator circuit (e.g., data comparator 814 and/or comparator power switch 816) according to a duty cycle. In some examples, the process 1000 may be performed by software modules that control the microcontroller 412.

At 1002, the process 1000 may cause a comparator circuit, a pull-up resistor circuit, and an AMR circuit to enter a low power mode for a first period of time. In some examples, this may comprise the microcontroller 412 turning off the AMR power and clock generator 808, the comparator power switch 816, and/or the pull-up resistor enable 812.

At 1004, in response to detecting an end of the first period of time, the process 1000 may cause the comparator circuit and at least one of the pull-up resistor circuit or the AMR circuit to switch from the low power mode to an active mode for a second period of time.

At 1006, the process 1000 may cause the comparator circuit to receive and store pulses from a water sensor for a second period of time, the second period of time being less than the first period of time. In some examples, the water sensor comprises a first type of sensor, and wherein the first type of sensor comprises at least one of a reed switch sensor, a Hall effect sensor, or a magneto-resistive sensor. In other examples, the water sensor comprises a second type of sensor, and wherein the second type of sensor comprises at least one of a pulse sensor or an AMR sensor.

At 1008, in response to detecting an end of the second period of time, the process 1000 may cause the comparator circuit and the at least one of the pull-up resistor circuit or the AMR circuit to switch from the active mode to the low power mode for the first period of time.

In some examples, the process 1000 may further include determining a rotational speed of the water sensor plugged into the one or more input ports, calculating the first period of time based at least in part on the rotational speed, and calculating the second period of time based at least in part on a rate at which the water sensor outputs pulses.

In various examples, the process 1000 further comprises receiving, from one or more server computing devices, an indication of the first period of time and an indication of the second period of time.

In some examples, the process 1000 may further include sending historical rotational speed data associated with the water sensor to one or more server computing devices, and receiving, from the one or more server computing devices, an indication of a third period of time, and adjusting the first period of time based at least in part on the third period of time.

Figure 11:
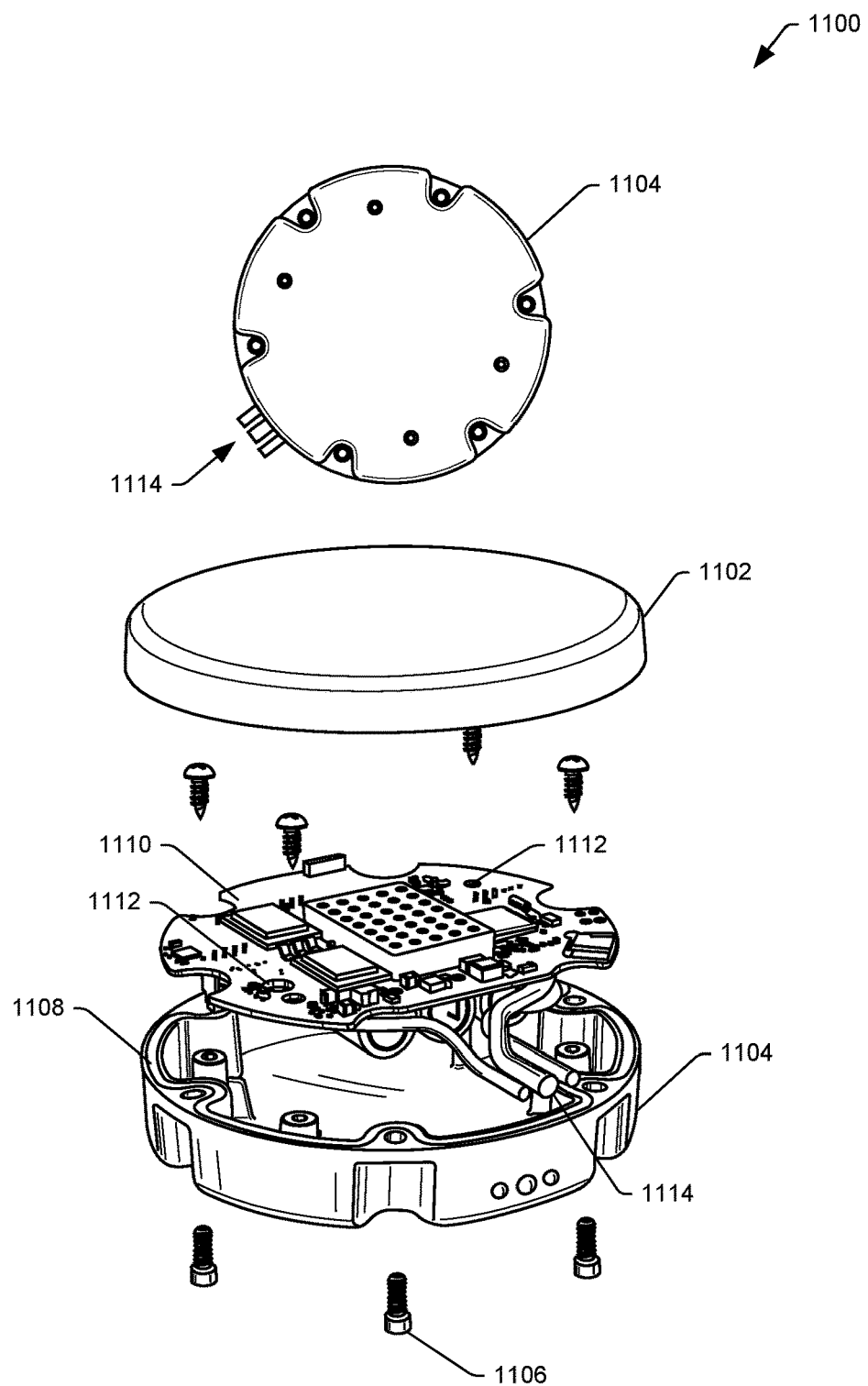
FIG. 11 depicts an example housing for an end device.

FIG. 11 depicts an example housing 1100 for an end device, such as end device 410. In some examples, the housing 1100 may generally be a clamshell shaped enclosure having a top cap 1102 and a bottom cap 1104. One or more fasteners 1106 may fasten the top cap 1102 and the bottom cap 1104 together. In some examples, a gasket 1108 may be inserted around a tongue-and-groove interior perimeter of the top cap 1102 and the bottom cap 1104, such that, when the top cap 1102 and bottom cap 1104 are fitted together in combination with gasket 1108, a water tight seal is created for the housing 1100 for the end device. In this way, gasket 1108 may minimize leak points inside of housing 1100. In some instances, a PCB 1110 on which the components of the end device 410 are placed may include openings 1112 through which the fasteners 1106 may pass through. As illustrated the housing 1100 may include connections 1114 to provide an electrical connection for one or more sensors, as discussed herein.

In some examples, the fasteners 1106 are thermally coupled to the PCB 1110 and serve as heat sinks for the housing 1100. Further, the example housing 1100 may include an external mounting bracket for mounting the device. In an implementation where the end device is a water meter monitoring water consumption for a water resource, the housing 1100 may be installed via a bracket on a pipe using one or more pipe clamps around the pipe and through the bracket. Further, the bracket and the pipe claims may be thermally coupled to the fasteners 1106 (and to the PCB, accordingly) to facilitate heat transfer from the end device to the pipe, for example.

In portions of FIGS. 4A-10, various components, and values for those components, are illustrated as being specific values. It is contemplated that, while the components and values depicted may be contemplated for some embodiments of the claimed invention, in some examples, other components or values may be selected that perform the same functions or operations described herein. Unless otherwise stated, components may be added, removed, or swapped, and other values may be utilized, for performing the functions described herein.

Example Concentrator

Figure 12:
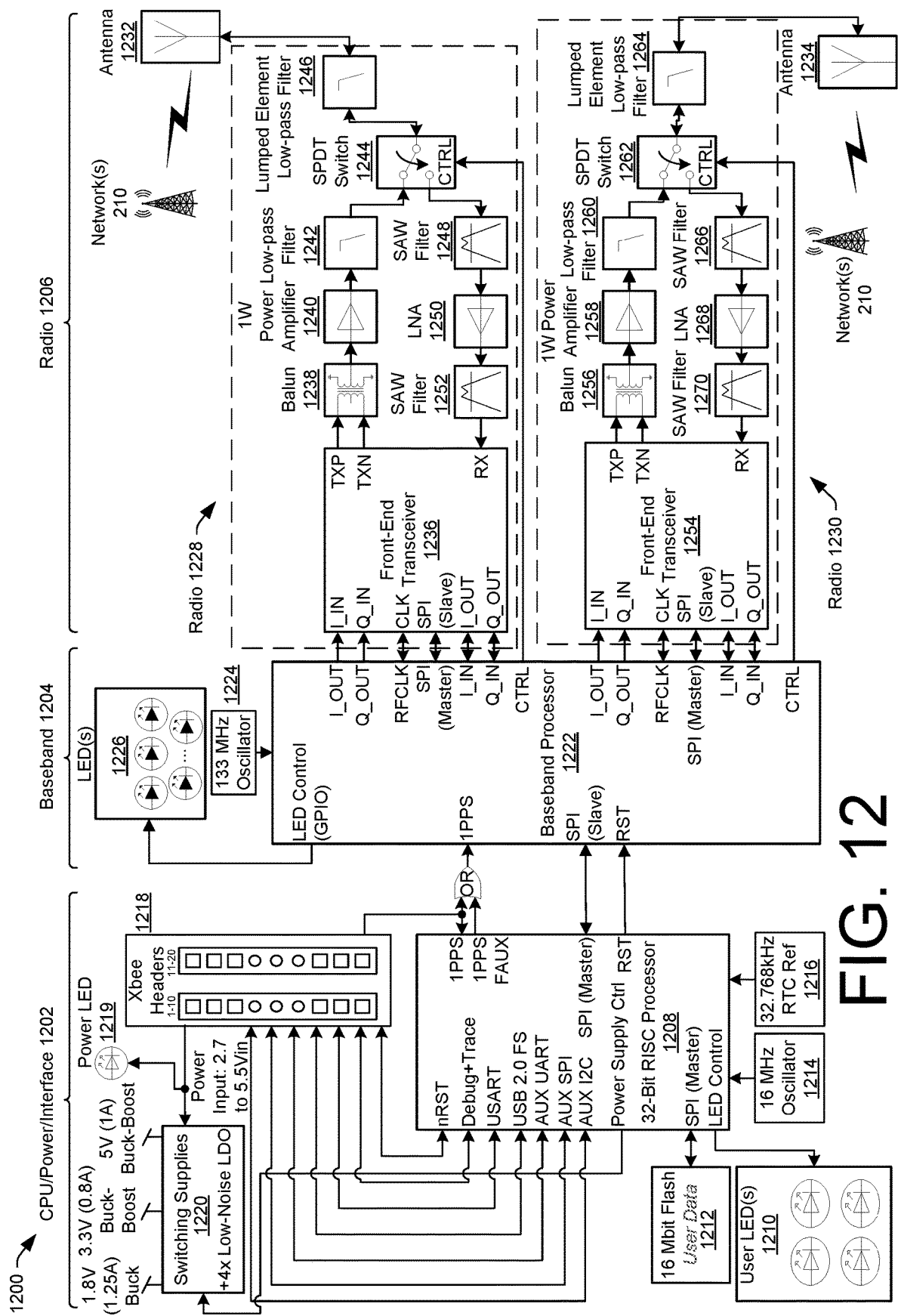
FIG. 12 illustrates a graphic representation of an example concentrator.

FIG. 12 illustrates a graphic representation of an example concentrator 1200, such as concentrator 262. In various examples, the concentrator 1200 may comprise a single chip disposed on a single PCB and included in a gateway device, such as gateway device(s) 202. In some examples, the concentrator 1200 may comprise a LoRaWAN® concentrator with antenna diversity, or simultaneous dual-band operation, including two independent RF paths, each with transmit and receive capability. In various examples, the concentrator 1200 may comply with various interface standards such as the XBee® interface standard. As discussed in the figures below, the concentrator 1200 may be of a relatively small size (e.g., 0.24 in$^3$) and lightweight (e.g., 7 grams).

In various examples, the concentrator 1200 may generally be categorized into three portions: a CPU/power/interface portion 1202, a baseband portion 1204, and a radio portion 1206.

In some examples, the CPU/power/interface portion 1202 may include a 32-bit RISC processor 1208 (e.g., ARM Cortex-M Processor) which controls operations of the concentrator 1200, such as power operations (e.g., power supply control, switching supply 1220 control, etc.) and various interfacing operations (e.g., User LEDs 1210 interfacing, 16 MHz Oscillator 1214 interfacing, 32.768 kHz RTC Ref 1216 interfacing, etc.). In various examples, the 32-Bit RISC processor 1208 may control operations of the concentrator 1200 and can include hardware, software, or firmware to perform or support the following functions, including but not limited to: 168 MHz CPU frequency; 1 MB flash; 192 KB of SRAM; up to 18 general purpose externally-available input/output (GPIO); a GPIO speed with maximum input/output toggling of 84 MHz; a crypto graphical hardware accelerator for AES 128, 192, 256, Triple DES, HASH (MD5, SHA-1), and HMAC; timers including twelve 16-bit and two 32-bit; three independent 12-bit analog-to-digital (ADC) converters with a sampling rate of 2.4 MSPS and 5 externally available channels; one externally-available 12-bit digital-to-analog converter (DAC) with an update rate of 1 MSPS and one externally available channel; a real-time clock (RTC) with an RTC reference of 32.768 kHz; one USB 2.0 port; two UART ports; one serial peripheral interface bus (SPI); one inter-integrated circuit (I$^2$C); and/or an integrated temperature sensor.

The 32-bit RISC processor 1208 may receive user input to control four (or any number of) user-configurable LEDs 1210, and store data via SPI bus in 16 Mbit of flash memory 1212 external to the processor chip 1208, such as user data. The concentrator further includes a 16 MHz oscillator 1214 to control the clock rate of the 32-bit RISC processor 1208, and a 32.768 kHz real-time clock (RTC) reference 1216.

CPU/power/interface portion 1202 of the concentrator 1200 may further include a 20-pin XBee® header 1218. In this way, the concentrator 1200 conforms with the industry standard form factor for XBee®. The 20-pin XBee® header 1218 may generally comprise a form factor compatible radio module that provides an input voltage of 2.7 volts to 5.5 volts to the switching supplies 1220. In some examples, the switching supplies 1220 may include a buck-boost converter to provide an output voltage of 3.3 volts (0.8 amps), another buck-boost converter to provide an output voltage of 5 volts (1 amp), a buck converter to provide an output voltage of 1.8 volts (1.25 amps), and four low-noise low-drop out (LDO) regulators for powering sensitive loads of the concentrator 1200. Further, the XBee® headers 1218 may provide power to a power LED 1219 to indicate that the concentrator 1200 is powered on.

In some examples, the baseband portion 1204 of the concentrator 1200 includes a baseband processor 1222 configured to manage functions of the concentrator 1200 generally related to radio functionality. In some examples, the baseband processor is designed for low-power, long range communication technologies (e.g., LoRaWAN®, or other communication protocols). In some examples, the baseband processor 1222 may have a receive sensitivity of up to −142.5 dBm. In various examples, a 133 MHz oscillator 1224 may determine the clock rate of the baseband processor 1222. In some examples, the baseband processor 1222 may control 5 LEDs 1226 which indicate a status of both baseband 1204 and radio 1206. In some examples, the 32-Bit RISC Processor 1208 may be programmable by a user of the concentrator 1200. For instance, the 32-Bit RISC Processor 1208 may receive one or more Attention (AT) commands through an interface, such as one of the USB interface or a UART interfaces. The AT commands may comprise ASCII characters that the 32-Bit RISC Processor 1208 is configured to process and understand. The AT commands may program the 32-Bit RISC Processor 1208, and thereby the baseband processor 1222, to perform various functions, such as changing the output power to 1-watt or ½ a watt, or issuing control commands to the concentrator 1200.

In various examples, the baseband processor 1222 may control two radios of the concentrator 1200, such as radio 1228 and radio 1230, for communicating using two respective antennas, such as antenna 1232 and antenna 1234, for communicating over the network(s) 210. As illustrated in FIG. 12, radio 1228 and radio 1230 may include the same or similar components to perform the same or similar functions. Accordingly, radio 1228 will be described, and the components of radio 1230 may perform similar functionality using similar components.

Radio 1228 may include a front-end transceiver 1236 configured to process a signal at a particular frequency or frequency range. In some examples, the front-end transceiver 1236 may include components to process a modulated signal received through the antenna 1232 into signals suitable for input into the baseband processor 1222, or alternatively module data received from the baseband processor 1222 into signals suitable for transmission using the antenna 1232. In some examples, the radio 1228 may include a transmit path including balun 1238, a 1-watt power amplifier 1240, and a low pass filter 1242. In various examples, the balun 1238 may convert between two received signals, such as a transmit differential pair (e.g., a balanced pair) received from the front-end transceiver 1236. The balun 1238 may output an unbalanced signal to the 1-watt power amplifier 1240, which amplifies the balanced signal up to a signal power of 1-watt for transmission. A signed of up to 1-watt in power may pass through the low pass filter 1242 to attenuate frequencies higher than the cutoff frequency of the low pass filter 1242, especially harmonic frequencies, to ensure electromagnetic compliance (EMC) with regulatory agencies such as the FCC. In some examples, the radio 1228 may further include a single-pole double-throw switch (SPDT) 1244 that is controlled by the baseband processor 1222 to select between the transmission path and a receive path of the radio 1228. The 1-watt unbalanced, filtered signal may pass through a lumped element low pass filter 1246, and in turn, may be communicated over the network(s) 210 via the antenna 1232.

As noted above, the radio 1228 may further include a receive path for receiving signals via the antenna 1232. The received signals may similarly pass through the lumped element low-pass filter 1246 and the SPDT switch 1244. The received signals may pass through the receive path to reach the front-end transceiver 1236, where the receive path may include a first surface acoustic wave (SAW) filter 1248, a low-noise amplifier (LNA) 1250, and a second SAW filter 1252. In some examples, the SAW filter 1248 and SAW filter 1252 may comprise bandpass filters. In various examples, the first saw filter 1248 may limit the frequency from the antennas to prevent the LNA 1250 from saturating, and the second SAW filter 1252 may help with out-of-band rejection of signals on the received signal.

Thus, the concentrator has two radios, or radio 1228 and radio 1230, and two antennas 1232 and 1234 which allows for diversity. Each radio may include a complete transmit and a complete receive path, and are completely redundant (e.g., channels on the same frequency may use either antenna 1232 or antenna 1234 based on the stronger signal). In some examples, the two radios and respective antennas allow for simultaneous dual channels. For example, one channel may operate at one frequency (e.g., 902 MHz), such as the low end of the medical radio (ISM) band, and one channel that operates at a second frequency (e.g., 928 MHz), such as a high end of the ISM band. As another example, for operation in European ISM bands, one channel may operate at one frequency (868 MHz) in order to receive LoRaWAN data, and one channel that operates at a second frequency (433 MHz) to allow for direct receipt of Wireless M-Bus. Additionally, each radio 1228 and 1230 is configured to transmit signals at a high signal power, such as 1-watt. Thus, the concentrator 1200 can communicate low-bandwidth signals over long distances using the high power signals.

In some examples, the 32-bit RISC processor 1208 may control the switching supplies 1220 to supply the 1-watt power amplifiers 1240 and 1258 of the radios 1228 and 1230 with various voltages depending on the transmit power. For example, the switching supplies 1220 may provide the 1-watt power amplifiers 1240 and 1258 with 5 volts for 1-watt signal transmissions, or provide the 1-watt amplifiers 1240 and 1258 with 3.75 volts for ½ watt signal transmission. In some examples, the differing voltages may maintain a 65% efficiency for the 1-watt power amplifiers 1240 and 1258 by ensuring the amplifiers operate in saturation. In various examples, the 32-bit RISC processor 1208 may turn on or off various power supplies, such as turning off the 5V buck-boost converter (or, more accurately, allowing the supply to enter power-efficient discontinuous modes) when the concentrator 1200 is not transmitting, which may conserve power.

In various examples, all the components discussed in FIG. 12 as being included the concentrator 1200 may be positioned on a single chip (e.g., the concentrator 1200). The components discussed may be selected based on them having a small form factor. For example, the concentrator 1200 may have a shield height under a 2-millimeter. The components of the concentrator 1200 may be selected based on their form factor. For example, the lumped element low pass filters 1246 and 1264, and SAW filters 1248, 1252, 1266, and 1270 may be selected for their small form factors. Other components of the concentrator 1200 may similarly have small form factors to reduce the size of the concentrator 1200. In some examples, the size of the concentrator 1200 may be 0.24 in$^3$ and have a weight of 7 grams. For example, the concentrator 1200 may have dimensions of 1.3"×0.96"× 0.19" while still complying with the XBee® interface standard.

Figure 13:
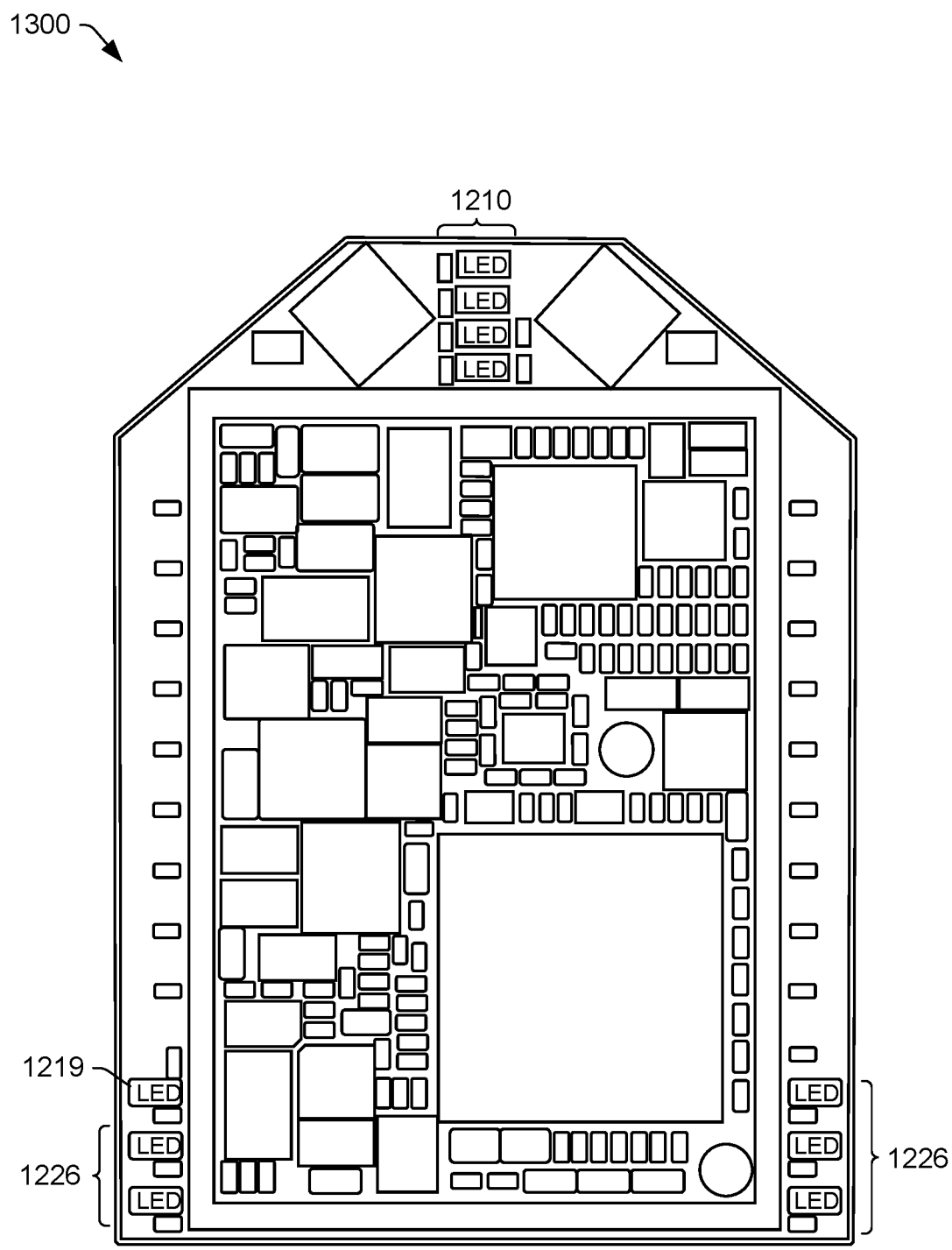
FIG. 13 illustrates a component layout of an example concentrator, including light emitting diodes (LEDs) of the example concentrator.

FIG. 13 illustrates a component layout of an example concentrator 1300, such as the concentrator 1200. The example component layout of the concentrator 1300 depicts positions of the various LEDs on the concentrator. For example, the four user-configurable LEDs 1210 are positioned at the top of the component lay out and outside of the shields, so that they remain visible even when the radio shields are in place. Further, the 5 LEDs 1226 which indicates the status of radio 1206 and baseband 1204 are positioned at the bottom of the component lay out, outside of the perimeter of the shield so they remain visible after the shield is installed. Further, the one power LED 1219 is positioned near the 5 LEDs 1226. The example concentrator 1300 component layout also depicts the positions of TVS and ESD diodes, placed next to every electrical connection available external to the shields, which allows for the example concentrator 1300 to be installed outside of ESD-safe environments. For example, the example concentrator 1300 could be retrofitted in the field without concern for device damage due to human handling.

Figure 14:
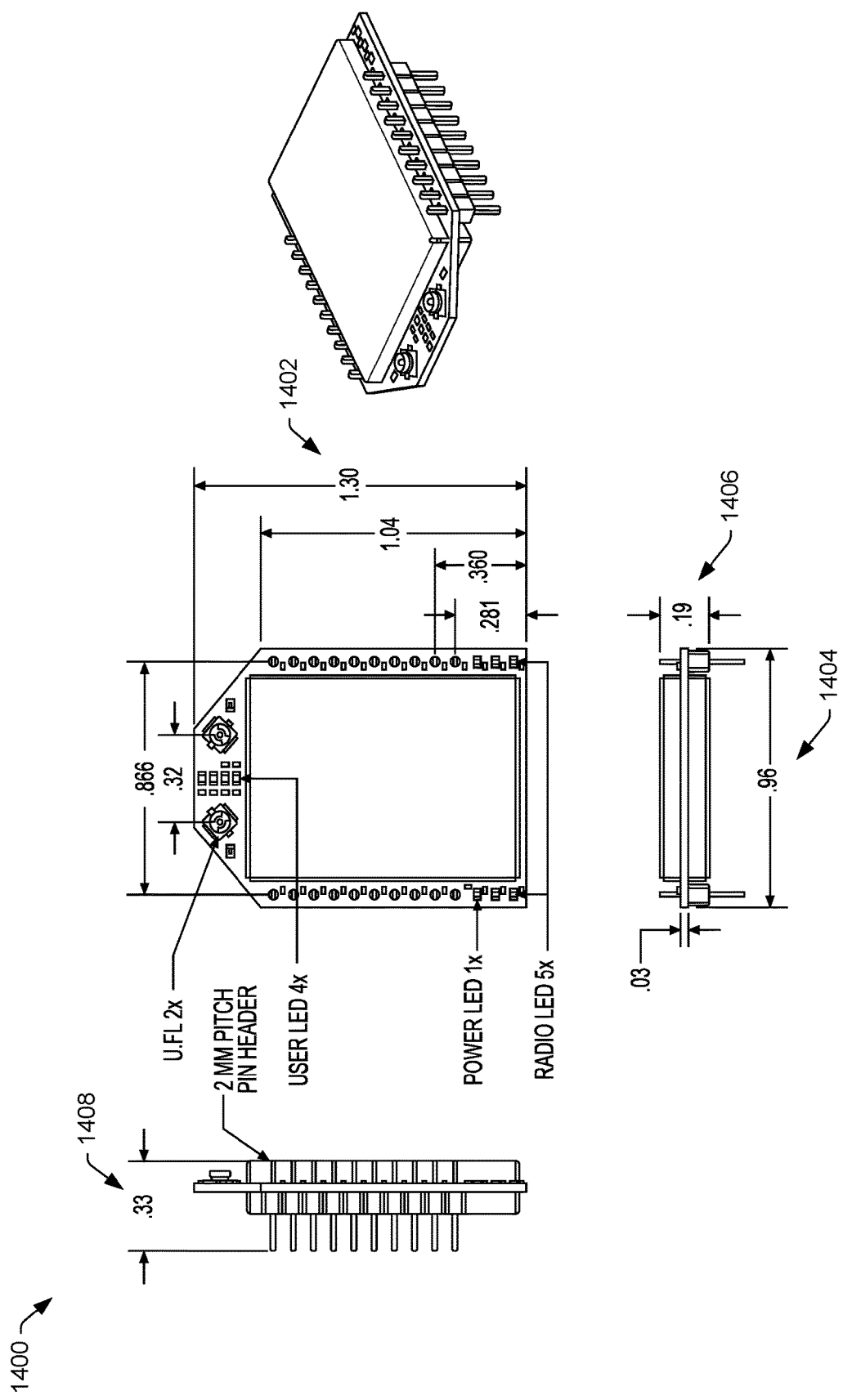
FIG. 14 illustrates example exterior views of a concentrator which illustrate dimensions of the concentrator.

FIG. 14 illustrates example exterior views of a concentrator 1400, such as concentrator 1200, which illustrate dimensions of the concentrator 1400. As shown, the concentrator 1400 may have a length 1402 of 1.30 inches, a width 1404 of 0.96 inches, and a height 1406 of 0.19 inches, not including the height of the pins. Including the height of the pins, the total height 1408 of the concentrator may be 0.33 inches.

FIG. 15 illustrates the small form factor of a concentrator 1500, such as concentrator 1200, relative to a quarter 1502 to give reference as to the small size of the concentrator 1500.

Example Graphical User Interfaces

Exemplary graphical user interfaces illustrating one or more alerts, signatures, reports, analysis, and/or historical data are shown in FIGS. 16-23B. As can be understood in the context of this disclosure, the service providers(s) 206 can analyze data received from the gateway device(s) 202 and/or from the end device 204, and can generate alerts, signatures, reports, and or GUIs, and transmit the alerts, signatures, reports, and/or GUIs to the computing device(s) 208 (and/or to the gateway device(s) 202) for display as a GUI or as an audio alert.

FIG. 16 shows a graphical user interface (GUI) 1600 illustrating a suspected event report and/or alert. In some embodiments, the GUI 1600 illustrates an email indicating a suspected operational waste alert. In some embodiments, the alert/report identifies potential remedies and provides instructions of how to identify the suspected operational waste. In some embodiments, the GUI 1600 may include images, pictures, and/or diagrams indicating where and/or what to look for to identify and correct the suspected event. In some embodiments, the images may reflect actual installation of equipment at a monitoring location, while in some embodiments, the image can reflect generic images based upon a model number of a particular piece of equipment. Further, the GUI 1600 can include a graph indicating water usage and one or more annotations indicating the suspected event, and/or the GUI 1600 can include a link to the graph.

Figure 17:
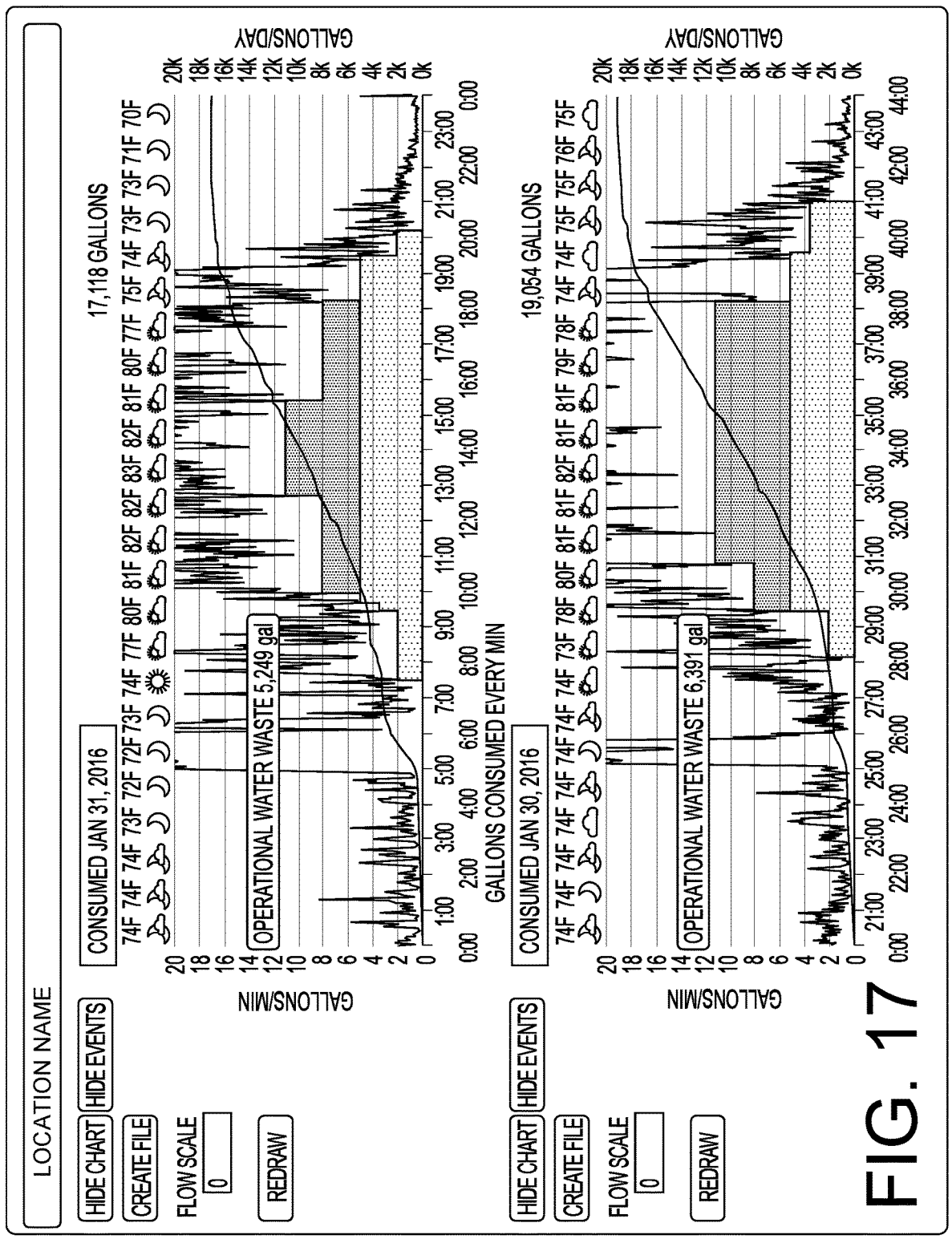
FIG. 17 is an example GUI that illustrates water usage for a monitoring location. A service provider may generate the GUI based on data received from an end device or a gateway device.

FIG. 17 shows a graphical user interfaces (GUI) 1700, illustrating water usage for a monitoring location. In some embodiments, the GUI 1700 illustrates a comparison of resource usage between two or more days. In some embodiments, the GUI 1700 can be annotated to indicate suspected mechanical or operational waste. In some embodiments, the GUI 1700 illustrates instantaneous water usage as a number of gallons consumed every minute. In some embodiments, the GUI 1700 illustrates an hourly weather and temperature, as well as a cumulative total of water usage throughout the day. In some embodiments, a user may toggle through various days to compare a current water usage with any historical data at a same and/or different location.

Figure 18:
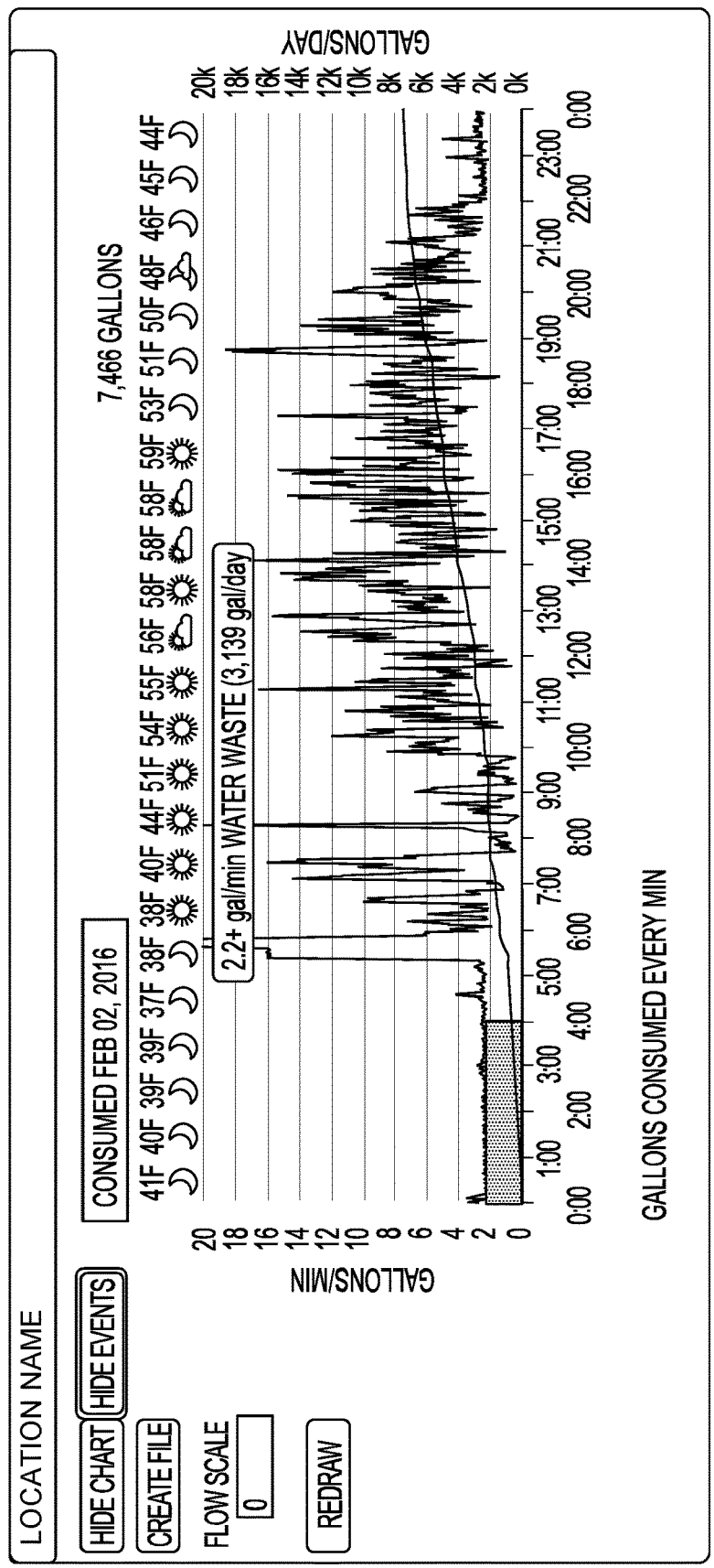
FIG. 18 is another GUI illustrating water usage for a monitoring location. A service provider may generate the GUI based on data received from an end device or a gateway device.
Figure 19D:
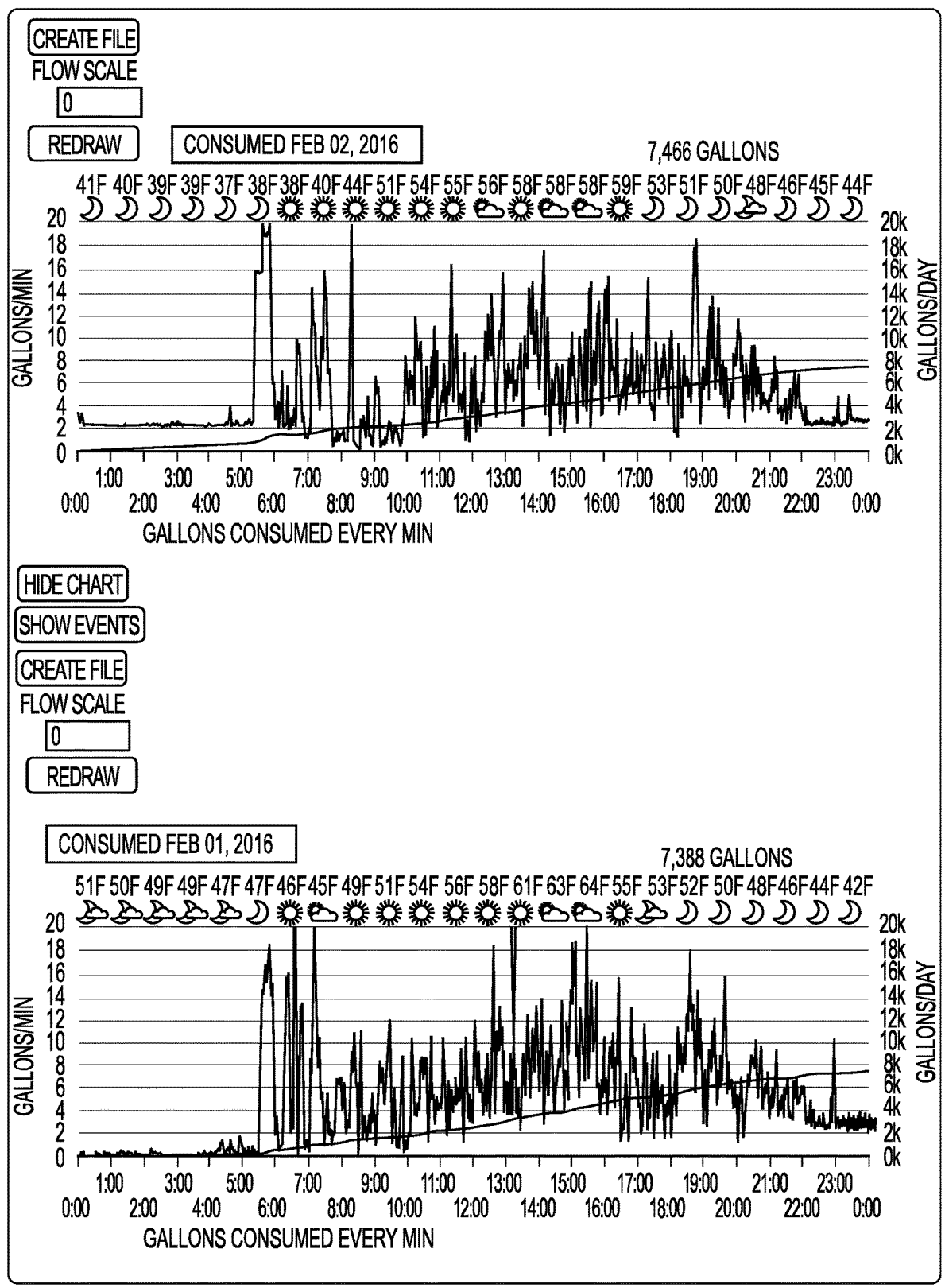

FIG. 18 shows a graphical user interface (GUI) 1800 illustrating water usage for a monitoring location. In some embodiments, the GUI 1800 illustrates analytics-generated annotations. In some embodiments, the annotations may be added manually, automatically, or may be flagged by an automated process and reviewed by a user. In some embodiments, the GUI 1800 can include visual representations of resource consumption by nodes or equipment at a monitoring location. As one non-limiting example, if a monitoring location includes three nodes, a GUI can illustrate three individual instantaneous resource consumption graphs for each node, with a further graph illustrating a total resource consumption. Further, node traces can be annotated or categorized according to an individual node's deviation from a historical or expected resource consumption value. In some embodiments, a user can select within a total resource consumption graph, causing an additional display to illustrate individual node contributions to the total resource consumption amounts. Thus, in this manner, a GUI can present several layers and resolutions of data to a user to understand a resource consumption at a total and/or node level.

FIGS. 19A, 19B, 19C, and 19D show an automated waste event 1900 tracking system. For example, FIGS. 19A-D provide an interface for a user to generate a report to one or more customers or email addresses to report and provide one or more recommendations to mitigate the waste event. For example, the system allows a report to be generated including recommendation and/or images reflecting resource usage.

FIG. 20 shows an analytics log 2000 for detected waste events, such as for a car wash location. In some embodiments, the analytics log 2000 provides a high-level indication of waste events which can provide an interface to link to more specific waste event reports, analytics, and recommendations.

FIG. 21 shows an automated alert tracking page 2100. In some embodiments, the page 2100 provides a search capability, allowing a user to search by start date, end date, site, node purpose, status, events, classes of events, severity of events, etc. Further, the page 2100 can provide links to more specific reports, statistics, and/or recommendations for the various sites and resource usage data.

FIG. 22 shows a GUI 2200 for generating and managing alerts. For example, the GUI 2200 can generate text automatically for alerting suspected waste events and for providing recommendations to remedy the suspected waste.

FIGS. 23A and 23B show a GUI 2300 illustrating site information and anomalies. For example, FIG. 23A illustrates a left portion of an alerting page, while FIG. 23B illustrates a right portion of the alerting page. In some embodiments, users may select one or more text, images, and/or links to receive specific information, reports, comparisons, and/or alerts regarding resource consumption information.

CONCLUSION

Although the present disclosure can use language that is specific to structural features and/or methodological acts, the invention is not limited to the specific features or acts described herein. Rather, the specific features and acts are disclosed as illustrative forms of implementing the invention.

What is claimed is:

1. A concentrator device comprising:
one or more antenna connectors;
a first processor to perform power functions and interfacing functions for the concentrator device;
a second processor to control a first radio and a second radio;
the first radio comprising a first transceiver to process a first signal at a first frequency;
the second radio comprising a second transceiver to process a second signal at a second frequency; and
a power supply controlled by the first processor to provide power to the first radio and the second radio;
wherein the concentrator device is capable of being removably coupled to a computing device and receiving signals from one or more sensors for collecting resource consumption data.

2. The concentrator device of claim 1, further comprising computer-readable media storing computer-executable instructions that, when executed by the first processor, cause the first processor to perform acts comprising:
causing the power supply to provide power at a first voltage to a first power amplifier of the first radio, wherein the first voltage causes the first power amplifier to saturate at a saturation voltage associated with the first power amplifier; and
causing the power supply to provide power at a second voltage to a second power amplifier of the second radio, wherein the second voltage causes the second power amplifier to saturate at a saturation voltage associated with the second power amplifier.

3. The concentrator device of claim 2, the acts further comprising:
transmitting, via the first radio, a first output radio frequency (RF) signal over a first period of time; and
transmitting, via the second radio, a second output RF signal over a second period of time, wherein the first period of time and the second period of time at least partially overlap.

4. The concentrator device of claim 1, further comprising computer-readable media storing computer-executable instructions that, when executed by the first processor, cause the first processor to perform acts comprising:
causing the power supply to provide power at a first voltage of approximately 3.75 volts or approximately 5 volts to a first power amplifier of the first radio, wherein the first voltage causes the first power amplifier to output a first radio frequency (RF) signal at a first signal power of approximately ½-watt or approximately 1-watt; and
causing the power supply to provide power at a second voltage of approximately 3.75 volts or approximately 5 volts to a second power amplifier of the second radio, wherein the second voltage causes the second power amplifier to output a second RF signal at a second signal power of approximately ½-watt or 1-watt.

5. The concentrator device of claim 1, wherein:
the first frequency is approximately 902 megahertz; and
the second frequency is approximately 928 megahertz.

6. The concentrator device of claim 1, wherein a volume of the concentrator device is less than approximately 0.25 in3.

7. The concentrator device of claim 1, wherein the first radio or the second radio communicates using a low-power, wide area network (LPWAN) protocol.

8. The concentrator device of claim 1, wherein:
the first receive path includes at least one of a first surface acoustic wave (SAW) filter, a first low-noise amplifier (LNA), or a second SAW filter; and
the second receive path includes at least one of a third SAW filter, a second LNA, or a fourth SAW filter.

9. A concentrator device comprising:
at least one processor to perform power functions and interfacing functions for the concentrator device;
a baseband processor to control a first radio of the concentrator device and a second radio of the concentrator device;
the first radio comprising a first transceiver and:
a first transmission path for transmitting one or more first signals, the first transmission path including at least one of a first balun, a first power amplifier, or a first low-pass filter; or
a first receive path for receiving one or more second signals;
the second radio comprising a second transceiver and:
a second transmission path for transmitting one or more third signals, the second transmission path including at least one of a second balun, a second power amplifier, or a second low-pass filter; or a second receive path for receiving one or more fourth signals;

a first antenna connector to transmit the one or more first signals for the first radio or to receive the one or more second signals for the first radio; and a second antenna connector to transmit the one or more third signals for the second radio or to receive the one or more fourth signals for the second radio.

10. The concentrator device of claim 9, wherein dimensions of the concentrator device comprise:
a height of approximately 0.19 inches;
a length of approximately 1.30 inches; and
a width of approximately 0.96 inches.

11. The concentrator device of claim 9, wherein:
the first radio further comprises:
a first switch, controllable by the baseband processor, to select between the first transmission path and the first receive path; and
a first lumped element low-pass filter disposed between the first switch and the first antenna connector; and
the second radio further comprises:
a second switch, controllable by the baseband processor, to select between the second transmission path and the second receive path; and
a second lumped element low-pass filter disposed between the second switch and the second antenna connector.

12. The concentrator device of claim 9, further comprising:
a first oscillator to control a clock rate of the at least one processor; and
a second oscillator to control a clock rate of the baseband processor, wherein a first frequency of the first oscillator is lower than a second frequency of the second oscillator.

13. The concentrator device of claim 9, further comprising a flash memory.

14. A concentrator device comprising:
one or more processors to perform power functions and interfacing functions for the concentrator device, and to control a first radio and a second radio;
a first antenna connector to transmit one or more first signals for the first radio or to receive one or more second signals for the first radio;
a second antenna connector to transmit one or more third signals for the second radio or to receive one or more fourth signals for the second radio; and
computer-readable media storing computer-executable instructions that, when executed by the one or more processors, causes the one or more processors to perform acts comprising:
generating a first signal as the one or more first signals for transmission by the first radio via the first antenna connector;
transmitting the first signal via the first antenna connector for a first period of time;
generating a second signal as the one or more third signals for transmission by the second radio via the second antenna connector; and
transmitting the second signal via the second antenna connector for a second period of time, wherein the first period of time and the second period of time at least partially overlap.

15. The concentrator device of claim 14, further comprising:
a switching supply to provide power to a first power amplifier of the first radio and a second power amplifier of the second radio; and
wherein the computer-executable instructions, when executed by the one or more processors, further cause the one or more processors to perform operations comprising:
causing the switching supply to provide power at a first voltage to the first power amplifier, wherein the first voltage causes the first power amplifier to saturate at a first power amplifier saturation voltage; and
causing the switching supply to provide power at a second voltage to the second power amplifier, wherein the second voltage causes the second power amplifier to saturate at a second power amplifier saturation voltage.

16. The concentrator device of claim 14, further comprising:
a switching supply to provide power to a first power amplifier of the first radio and a second power amplifier of the second radio;
wherein the computer-executable instructions, when executed by the one or more processors, further cause the one or more processors to perform operations comprising:
causing the switching supply to provide power at a first voltage to the first power amplifier, wherein the first voltage causes the first power amplifier to amplify the first signal to a first power; and
causing the switching supply to provide power at a second voltage to the second power amplifier, wherein the second voltage causes the second power amplifier to amplify the second signal to a second power,
wherein the first voltage is different than the second voltage, and the first power is different than the second power.

17. The concentrator device of claim 14, wherein:
the first signal is transmitted at a first channel frequency; and
the second signal is transmitted at a second channel frequency;
the first channel frequency and the second channel frequency both being within a band of:
approximately 902 megahertz to approximately 928 megahertz;
approximately 863 megahertz to approximately 870 megahertz; or
approximately 779 megahertz to approximately 787 megahertz.

18. The concentrator device of claim 14, wherein a volume of the concentrator device is less than approximately 0.25 inches cubed.

19. The concentrator device of claim 14, wherein the first radio or the second radio communicates using a low-power, wide area network (LPWAN) protocol.

20. The concentrator device of claim 14, wherein the computer-readable media comprises a flash memory.

* * * * *